(12) United States Patent
Ito et al.

(10) Patent No.: US 8,427,133 B2
(45) Date of Patent: Apr. 23, 2013

(54) CURRENT DETECTION APPARATUS

(75) Inventors: Kohei Ito, Anjo (JP); Tatsuyuki Uechi, Toyoake (JP); Tomoyuki Suzuki, Anjo (JP)

(73) Assignee: Aisin AW Co., Ltd., Anjo (JP)

( * ) Notice: Subject to any disclaimer, the term of this patent is extended or adjusted under 35 U.S.C. 154(b) by 324 days.

(21) Appl. No.: 12/654,206

(22) Filed: Dec. 14, 2009

(65) Prior Publication Data
US 2010/0194381 A1    Aug. 5, 2010

(30) Foreign Application Priority Data

Jan. 30, 2009    (JP) .................................. 2009-020538

(51) Int. Cl.
    *G01R 15/20*    (2006.01)
(52) U.S. Cl.
    USPC .................................. 324/117 R; 324/117 H
(58) Field of Classification Search ............... 324/117 R, 324/117 H, 127, 765.01
    See application file for complete search history.

(56) References Cited

U.S. PATENT DOCUMENTS

| | | | |
|---|---|---|---|
| 6,414,475 B1 * | 7/2002 | Dames et al. .................. | 324/127 |
| 6,441,604 B1 * | 8/2002 | Gohara et al. .............. | 324/117 R |
| 6,459,255 B1 | 10/2002 | Tamai et al. | |
| 7,012,446 B2 * | 3/2006 | Taguchi et al. ........... | 324/117 R |
| 7,463,016 B2 * | 12/2008 | Shoji ....................... | 324/117 R |
| 7,538,540 B2 | 5/2009 | Tsukamoto | |
| 7,663,358 B2 * | 2/2010 | Hashio et al. ............. | 324/117 R |
| 7,898,240 B2 * | 3/2011 | Shibahara et al. ......... | 324/117 R |
| 8,081,491 B2 * | 12/2011 | De Geus et al. .............. | 361/836 |
| 8,310,121 B2 * | 11/2012 | Fujita et al. ..................... | 310/71 |
| 2006/0082357 A1 * | 4/2006 | Tsukamoto .................. | 324/126 |

FOREIGN PATENT DOCUMENTS

| | | | |
|---|---|---|---|
| JP | A 04-047274 | | 2/1992 |
| JP | A 2001-074783 | | 3/2001 |
| JP | 2005233692 | * | 2/2005 |
| JP | A-2006-112968 | | 4/2006 |
| JP | A-2009-020085 | | 1/2009 |

OTHER PUBLICATIONS

International Search Report mailed Feb. 23, 2010 for PCT/JP2009/070838.
Jan. 24, 2013 Office Action issued in Japanese Patent Application No. 2009-020538.

* cited by examiner

*Primary Examiner* — Joshua Benitez Rosario
(74) *Attorney, Agent, or Firm* — Oliff & Berridge, PLC

(57) ABSTRACT

A current detection apparatus where a sensor unit that detects the magnetic field in a predetermined magnetic field detection direction is disposed in a vicinity such that the magnetic field detection direction is substantially orthogonal to an extension direction of the subject bus bar at the detection portion, one of the plurality of bus bars disposed adjacent to the subject bus bar is set as an adjacent bus bar, a plane that is orthogonal to an extension direction of each portion of the adjacent bus bar is set as an extension orthogonal plane of the portion, and the extension direction of each portion of the adjacent bus bar relative to the sensor unit is set such that none of the extension orthogonal planes of the respective portions of the adjacent bus bar pass through the sensor unit in a parallel direction to the magnetic field detection direction.

10 Claims, 11 Drawing Sheets

F I G . 12
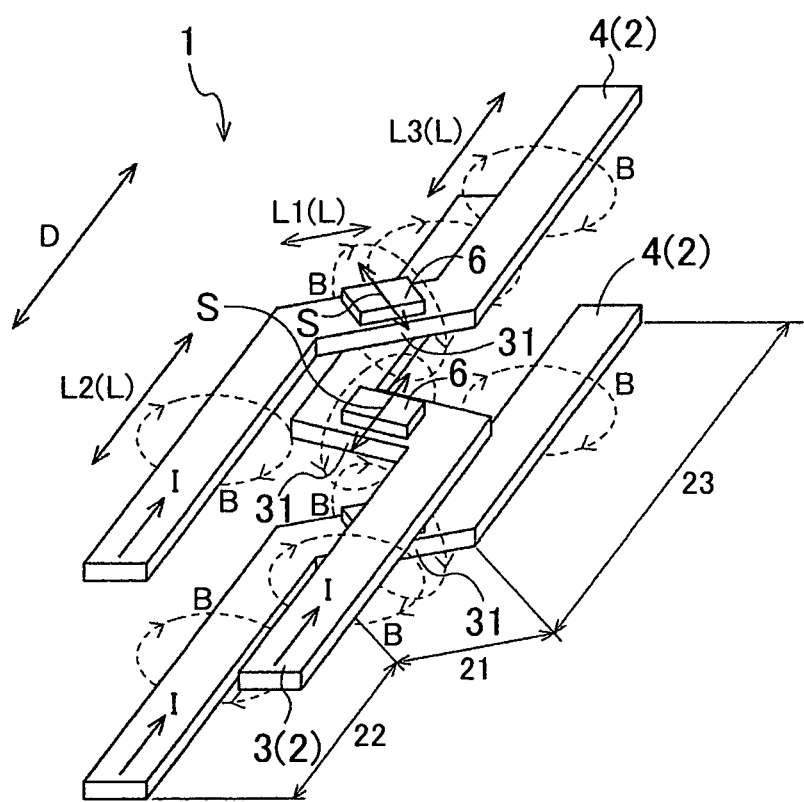

CURRENT DETECTION APPARATUS

INCORPORATION BY REFERENCE

The disclosure of Japanese Patent Application No. 2009-020538 filed on Jan. 30, 2009 including the specification, drawings and abstract is incorporated herein by reference in its entirety.

BACKGROUND

The present invention relates to a current detection apparatus in which at least one of a plurality of bus bars disposed in parallel is set as a subject bus bar, and a current flowing through the subject bus bar is detected on the basis of a magnetic field generated in the vicinity of the subject bus bar.

With regard to a current detection apparatus that sets a plurality of bus bars disposed in parallel as subject bus bars and detects a current flowing through the subject bus bars on the basis of a magnetic field generated in the vicinity of the subject bus bars, Japanese Patent Application Publication No. JP-A-2006-112968, for example, describes a current detection apparatus in the constitution as described below. The current detection apparatus includes three current sensors that set three bus bars disposed in parallel as subject bus bars and detect a current flowing through each bus bar, for example. The current detection apparatus also includes a magnetic shield attached to each bus bar. The three current sensors are disposed on the three bus bars disposed in parallel in mutually deviating positions along the respective bus bars. Likewise, the magnetic shields attached to the respective bus bars are disposed in mutually deviating positions along the respective bus bars. The plurality of magnetic shields and the plurality of current sensors form a so-called hound's tooth check arrangement, and as a result, magnetic interference between the current sensor and the adjacent bus bar can be avoided.

SUMMARY

However, in the current detection apparatus described in Japanese Patent Application Publication No. JP-A-2006-112968, the magnetic shield need be provided on each bus bar, and therefore the constitutional complexity of the apparatus increases correspondingly together with an increase in the number of manufacturing steps, leading to an increase in manufacturing cost. However, when the magnetic shields are simply eliminated from the constitution of the current detection apparatus described in Japanese Patent Application Publication No. JP-A-2006-112968, the current sensor is more likely to be affected by the magnetic field generated by the adjacent bus bar, making high precision current detection difficult.

The present invention has been designed in consideration of this problem, and it is an object of the present invention to realize, at low cost, a current detection apparatus capable of performing current detection with a high degree of precision while suppressing the effect of a magnetic field from an adjacent bus bar, in the case where a plurality of bus bars are disposed in parallel, in a simple constitution achieved by simply setting the shape of each part of the bus bar and arrangement of the bus bars appropriately.

To achieve this object, in a characteristic constitution of a current detection apparatus according to the present invention, which sets at least one of a plurality of bus bars disposed in parallel as a subject bus bar and detects a current flowing through the subject bus bar on the basis of a magnetic field generated in the vicinity of the subject bus bar, a sensor unit that detects the magnetic field in a predetermined magnetic field detection direction is disposed in the vicinity of a detection portion of the subject bus bar such that the magnetic field detection direction is substantially orthogonal to an extension direction of the subject bus bar at the detection portion, one of the plurality of bus bars that is disposed adjacent to the subject bus bar is set as an adjacent bus bar, a plane that is orthogonal to an extension direction of each portion of the adjacent bus bar is set as an extension orthogonal plane of the portion, and the extension direction of each portion of the adjacent bus bar relative to the sensor unit is set such that none of the extension orthogonal planes of the respective portions of the adjacent bus bar pass through the sensor unit in a parallel direction to the magnetic field detection direction.

Note that in the present application, a state in which the sensor unit is disposed in the vicinity of the detection portion of the subject bus bar indicates a state in which the sensor unit is disposed in contact with the detection portion of the subject bus bar or disposed away from the detection portion by a predetermined distance. Further, the predetermined distance is set at a distance at which the magnetic field generated by the subject bus bar can be detected by the sensor unit.

Magnetic flux of the magnetic field that is generated from each portion of the bus bar when a current is caused to flow through the bus bar basically travels in an extension orthogonal plane orthogonal to the extension direction of each portion. According to this characteristic constitution, from among the extension orthogonal planes of the respective portions of the adjacent bus bar, an extension orthogonal plane that passes through the sensor unit in a parallel direction to the magnetic field detection direction of the sensor unit does not exist, and therefore a situation in which the magnetic flux of the magnetic field generated from each portion of the adjacent bus bar passes through the sensor unit in a parallel direction to the magnetic field detection direction of the sensor unit basically never occurs. Accordingly, situations in which the sensor unit detects a magnetic field from the adjacent bus bar can be suppressed, and therefore the magnetic field generated by the subject bus bar can be detected by the sensor unit with a high degree of precision. Hence, according to this current detection apparatus, a current flowing through a subject bus bar can be detected with a high degree of precision. Furthermore, according to this characteristic constitution, the magnetic field from the adjacent bus bar can be prevented from affecting the sensor unit by means of a simple constitution achieved simply by setting the extension direction of each portion of the adjacent bus bar relative to the sensor unit appropriately. Therefore, a current detection apparatus that can detect a current with a high degree of precision can be provided using an inexpensive constitution and without the need to provide a special constitution such as a magnetic shield in order to secure detection precision.

Here, the extension direction of each portion of the adjacent bus bar relative to the sensor unit may be set such that none of the extension orthogonal planes of the respective portions of the adjacent bus bar pass through the sensor unit.

According to this constitution, none of the extension orthogonal planes of the respective portions of the adjacent bus bar pass through the sensor unit, and therefore the magnetic flux of the magnetic field generated from each portion of the adjacent bus bar basically never passes through the sensor unit. Hence, situations in which the magnetic field of the adjacent bus bar is detected by the sensor unit can be greatly suppressed, and as a result, the magnetic field generated by the subject bus bar can be detected by the sensor unit with an even higher degree of precision. Therefore, according to this current detection apparatus, the current flowing through the subject bus bar can be detected with a high degree of precision.

Alternatively, the extension direction of each portion of the adjacent bus bar relative to the sensor unit may be set such that, from among the extension orthogonal planes of the respective portions of the adjacent bus bar, an extension orthogonal plane that passes through the sensor unit passes through the sensor unit in an intersecting direction relative to the magnetic field detection direction.

According to this constitution, from among the extension orthogonal planes of the respective portions of the adjacent bus bar, the extension orthogonal plane that passes through the sensor unit passes through the sensor unit in the intersecting direction relative to the magnetic field detection direction, and therefore the magnetic flux of the magnetic field generated from each portion of the adjacent bus bar basically also passes through the sensor unit in the intersecting direction relative to the magnetic field detection direction of the sensor unit. Hence, of the magnetic field generated by the adjacent bus bar, only the vector component of the magnetic field in the magnetic field detection direction is detected by the sensor unit. Accordingly, situations in which the magnetic field from the adjacent bus bar is detected by the sensor unit can be suppressed, and as a result, the magnetic field generated by the subject bus bar can be detected by the sensor unit with a high degree of precision. Therefore, according to this current detection apparatus, the current flowing through the subject bus bar can be detected with a high degree of precision.

Further, when the extension orthogonal plane passes through the sensor unit in the intersecting direction relative to the magnetic field detection direction, the extension orthogonal plane that passes through the sensor unit may be set to pass through the sensor unit in a substantially orthogonal direction to the magnetic field detection direction.

According to this constitution, the extension orthogonal plane that passes through the sensor unit, from among the extension orthogonal planes of the respective portions of the adjacent bus bar, passes through the sensor unit in the substantially orthogonal direction to the magnetic field detection direction, and therefore the magnetic flux of the magnetic field generated from each portion of the adjacent bus bar basically also passes through the sensor unit in the substantially orthogonal direction to the magnetic field detection direction of the sensor unit. Hence, the vector component, in the magnetic field detection direction, of the magnetic field generated by the adjacent bus bar and detected by the sensor unit is basically zero. Accordingly, situations in which the magnetic field of the adjacent bus bar is detected by the sensor unit can be greatly suppressed, and as a result, the magnetic field generated by the subject bus bar can be detected by the sensor unit with an even higher degree of precision. Therefore, according to this current detection apparatus, the current flowing through the subject bus bar can be detected with a high degree of precision.

Further, the plurality of bus bars may each include a first side parallel region that is disposed on a first side of a predetermined reference direction and has an extension direction that is parallel to the reference direction, and a second side parallel region that is disposed on a second side of the reference direction relative to the first side parallel region and has an extension direction that is parallel to the reference direction, and at least one of the plurality of bus bars may include a bent region that is disposed between the first side parallel region and the second side parallel region and has an extension direction that is different from the reference direction.

According to this constitution, the direction of the extension orthogonal plane of the bent region provided in at least one of the plurality of bus bars is different from the direction of the extension orthogonal planes of the first side parallel region and second side parallel region provided in another adjacent bus bar. By taking advantage of this difference in directions between the extension orthogonal plane of the bent region and the extension orthogonal planes of the first side parallel region or the second side parallel region, it is easy to set the extension direction of each portion of the adjacent bus bar relative to the sensor unit such that none of the extension orthogonal planes of the respective portions of the adjacent bus bar pass through the sensor unit in a parallel direction to the magnetic field detection direction. Hence, a current detection apparatus that can detect a current with a high degree of precision can be provided using an inexpensive and simple constitution, and without the need to provide a special constitution such as a magnetic shield in order to secure detection precision.

Further, in the above constitution, the subject bus bar may include the bent region, and the detection portion may be provided in the bent region.

According to this constitution, the sensor unit is disposed in the vicinity of the bent region provided in the subject bus bar and oriented so that the extension direction of the bent region and the magnetic field detection direction are substantially orthogonal. Thus, the magnetic field detection direction of the sensor unit can be set in an intersecting direction relative to the direction of the extension orthogonal planes of the first and second side parallel regions of the adjacent bus bar. As a result, it is even easier to set the extension direction of each portion of the adjacent bus bar relative to the sensor unit such that none of the extension orthogonal planes of the respective portions of the adjacent bus bar pass through the sensor unit in a parallel direction to the magnetic field detection direction.

Furthermore, in the above constitution, all of the plurality of bus bars may include the bent regions having identical extension directions, and the bent region provided in the adjacent bus bar may be disposed so as not to overlap the sensor unit in the extension direction of the bent region.

Note that in the present application, "overlapping" in a predetermined direction is used as a concept representing a state in which two members or regions are disposed at least partially in identical positions with regard to the arrangement of the members or regions in this direction. In other words, a state in which two members or regions "overlap" in a predetermined direction indicates a state in which the two members or regions are disposed at least partially in identical positions on a parallel coordinate axis to the direction, regardless of the positions on the orthogonal coordinate axis to the predetermined direction.

According to this constitution, the extension orthogonal plane of each portion in the bent region of the adjacent bus bar is parallel to the magnetic field detection direction of the sensor unit for which the bent region of the subject bus bar is provided as the detection portion, but the respective bent regions of the plurality of bus bars are disposed such that none of the extension orthogonal planes of the respective portions in the bent region of the adjacent bus bar pass through the sensor unit. Furthermore, the extension orthogonal planes in the respective portions of the first side and second side parallel regions of the adjacent bus bar are oriented to intersect the magnetic field detection direction of the sensor unit. Hence, using a simple constitution achieved simply by providing the plurality of bus bars with the respective bent regions having identical extension directions, the extension orthogonal planes of the respective portions of the adjacent bus bar can be set such that none of the extension orthogonal planes pass through the sensor unit in a parallel direction to the magnetic field detection direction.

Further, in the above constitution, the extension direction of the bent region may be set in a substantially orthogonal direction to the reference direction.

According to this constitution, the respective bent regions of the plurality of bus bars are disposed such that none of the extension orthogonal planes of the respective portions in the bent region of the adjacent bus bar pass through the sensor unit. Furthermore, the extension orthogonal plane of each portion in the first side parallel region and second side parallel region of the adjacent bus bar has the substantially orthogonal direction to the magnetic field detection direction of the sensor unit. Hence, using a simple constitution achieved simply by providing each of the plurality of bus bars with the bent region having the extension direction that is substantially orthogonal to the reference direction, the vector component, in the magnetic field detection direction, of the magnetic field generated by the adjacent bus bar and detected by the sensor unit can be set at basically zero. As a result, situations in which the magnetic field of the adjacent bus bar is detected by the sensor unit can be suppressed greatly.

Further, in the constitution in which the detection portion used by the sensor unit is provided in the bent region of the subject bus bar, two of the bus bars that are adjacent to each other may include the bent regions having the different extension directions from each other.

According to this constitution, the respective bent regions of the two bus bars that are adjacent to each other are disposed such that the extension orthogonal planes of the respective portions in the bent region of the adjacent bus bar intersect the magnetic field detection direction of the sensor unit for which the bent region of the subject bus bar is provided as the detection portion. Furthermore, the extension orthogonal plane of each portion in the first side parallel region and second side parallel region of the adjacent bus bar is also oriented to intersect the magnetic field detection direction of the sensor unit. Hence, using a simple constitution achieved simply by providing the plurality of bus bars with the respective bent regions having the different extension directions, the extension orthogonal planes of the respective portions of the adjacent bus bar can be set such that none of the extension orthogonal planes pass through the sensor unit in the parallel direction to the magnetic field detection direction.

Further, all of the plurality of bus bars may include the bent region, and the first side parallel region and the second side parallel region of the adjacent bus bar may be disposed so as not to overlap the sensor unit in the reference direction.

According to this constitution, the extension orthogonal planes of the respective portions in the first side and second side parallel regions of the adjacent bus bar can be set such that none of the extension orthogonal planes pass through the sensor unit for which the bent region is provided as the detection portion. Furthermore, according to this constitution, the bent region of the subject bus bar is disposed adjacent to the bent region of the adjacent bus bar, and the extension orthogonal plane of each portion in the bent region of the adjacent bus bar is inclined toward a first side of the reference direction or a second side of the reference direction relative to a direction heading toward the bent region of the subject bus bar. Hence, according to this constitution, an interval can be set appropriately between the subject bus bar and the adjacent bus bar in the orthogonal direction to the reference direction, and as a result, the constitution in which none of the extension orthogonal planes of the respective portions of the adjacent bus bar pass through the sensor unit, or the constitution in which the extension orthogonal plane that passes through the sensor unit, from among the extension orthogonal planes of the respective portions of the adjacent bus bar, passes through the sensor unit in the intersecting direction relative to the magnetic field detection direction, can be realized easily.

Further, the plurality of bus bars may be constituted by identically shaped members.

According to this constitution, the need to use a plurality of types of bus bars having different shapes in order to realize the bus bar arrangement constitution described above can be eliminated, and as a result, the current detection apparatus can be constructed at comparatively low cost.

Further, center lines of the plurality of bus bars may be disposed to be coplanar.

According to this constitution, the plurality of bus bars can be disposed in a comparatively small space easily.

Further, the above constitutions according to the present invention may be employed favorably in a driving apparatus for a rotary electric machine driven by a three-phase alternating current or the like, and in this case, the plurality of bus bars may be constituted by three bus bars through which the three-phase alternating current for driving the rotary electric machine flows, and at least two of the three bus bars are set as the subject bus bar.

Note that in the present application, the term "rotary electric machine" is used as a concept encompassing any of a motor, a generator, and a motor/generator that functions as both a motor and a generator according to necessity.

Furthermore, with the above constitutions according to the present invention, situations in which the magnetic field from the adjacent bus bar is detected by the sensor unit can be suppressed, as described above, and therefore the sensor unit is preferably constituted by a coreless magnetic field detection sensor not having a flux concentration core, and is particularly suited to a constitution that does not include a shield against an external magnetic field other than the magnetic field generated by the subject bus bar.

In another characteristic constitution of the current detection apparatus according to the present invention, which sets at least one of a plurality of bus bars disposed in parallel as a subject bus bar and detects a current flowing through the subject bus bar on the basis of a magnetic field generated in the vicinity of the subject bus bar, a sensor unit that detects the magnetic field in a predetermined magnetic field detection direction is disposed in the vicinity of a detection portion of the subject bus bar such that the magnetic field detection direction is substantially orthogonal to an extension direction of the bus bar at the detection portion, the plurality of bus bars each include a first side parallel region that is disposed on a first side of a predetermined reference direction and has an extension direction that is parallel to the reference direction, and a second side parallel region that is disposed on a second side of the reference direction relative to the first side parallel region and has an extension direction that is parallel to the reference direction, and at least the subject bus bar includes a bent region that is disposed between the first side parallel region and the second side parallel region and has an extension direction that is different from the reference direction, and the detection portion is provided in the bent region.

According to this characteristic constitution, when the bus bar disposed adjacent to the subject bus bar, from among the plurality of bus bars disposed in parallel, is set as the adjacent bus bar, the direction of the extension orthogonal plane of the bent region provided in at least the subject bus bar is different from the direction of the extension orthogonal planes of the first side parallel region or the second side parallel region of the adjacent bus bar. Hence, the magnetic field detection direction of the sensor unit for which the detection portion is provided in the bent region of the subject bus bar can be set to intersect the direction of the extension orthogonal planes of the first side parallel region and second side parallel region of the adjacent bus bar. As a result, it is easy to set the extension direction of each portion of the adjacent bus bar relative to the sensor unit such that none of the extension orthogonal planes of the respective portions of the adjacent bus bar pass through the sensor unit in a parallel direction to the magnetic field detection direction. Therefore, according to this characteristic constitution, the effect of the magnetic field generated by the adjacent bus bar on the sensor unit can be suppressed by means of a simple constitution, and as a result, a current detection apparatus that can detect a current with a high degree of precision can be provided using an inexpensive constitution and without the need to provide a special constitution such as a magnetic shield in order to secure detection precision.

Further, in the above constitution, all of the plurality of bus bars may include the bent regions having identical extension directions, and the bent region provided in one of the bus bars disposed adjacent to the subject bus bar may be disposed so as not to overlap the sensor unit in the extension direction of the bent region.

According to this constitution, the extension orthogonal plane of each portion in the bent region of the adjacent bus bar is parallel to the magnetic field detection direction of the sensor unit for which the bent region of the subject bus bar is provided as the detection portion, but the respective bent regions of the plurality of bus bars are disposed such that none of the extension orthogonal planes of the respective portions in the bent region of the adjacent bus bar pass through the sensor unit. Furthermore, the extension orthogonal plane of each portion in the first side parallel region and second side parallel region of the adjacent bus bar is oriented to intersect the magnetic field detection direction of the sensor unit. Hence, using a simple constitution achieved simply by providing the plurality of bus bars with the respective bent regions having the identical extension directions, the extension orthogonal planes of the respective portions of the adjacent bus bar can be set such that none of the extension orthogonal planes pass through the sensor unit in the parallel direction to the magnetic field detection direction.

Further, in the above constitution, the extension direction of the bent region may be set in a substantially orthogonal direction to the reference direction.

According to this constitution, the respective bent regions of the plurality of bus bars are disposed such that none of the extension orthogonal planes of the respective portions in the bent region of the adjacent bus bar pass through the sensor unit. Furthermore, the extension orthogonal plane of each portion in the first side parallel region and second side parallel region of the adjacent bus bar has a substantially orthogonal direction to the magnetic field detection direction of the sensor unit. Hence, using a simple constitution achieved simply by providing each of the plurality of bus bars with the bent region having the extension direction that is substantially orthogonal to the reference direction, the vector component, in the magnetic field detection direction, of the magnetic field generated by the adjacent bus bar and detected by the sensor unit can be set at basically zero. As a result, situations in which the magnetic field of the adjacent bus bar is detected by the sensor unit can be suppressed greatly.

Further, the subject bus bar and one of the bus bars that is disposed adjacent to the subject bus bar may include the respective bent regions having the different extension directions from each other.

According to this constitution, the respective bent regions of the subject bus bar and adjacent bus bar are disposed such that the extension orthogonal plane of each portion in the bent region of the adjacent bus bar intersects the magnetic field detection direction of the sensor unit for which the bent region of the subject bus bar is provided as the detection portion. Further, the extension orthogonal plane of each portion in the first side parallel region and second side parallel region of the adjacent bus bar also intersects the magnetic field detection direction of the sensor unit. Hence, using a simple constitution achieved simply by providing the subject bus bar and the adjacent bus bar with the respective bent regions having the different extension directions, the extension orthogonal planes of the respective portions of the adjacent bus bar can be set such that none of the extension orthogonal planes pass through the sensor unit in the parallel direction to the magnetic field detection direction.

Further, all of the plurality of bus bars may include the bent region, and the first side parallel region and the second side parallel region of the adjacent bus bar disposed adjacent to the subject bus bar may be disposed so as not to overlap the sensor unit in the reference direction.

According to this constitution, the extension orthogonal planes of the respective portions in the first side parallel region and second side parallel region of the adjacent bus bar can be set such that none of the extension orthogonal planes pass through the sensor unit for which the bent region is provided as the detection portion. Furthermore, according to this constitution, the bent region of the subject bus bar is disposed adjacent to the bent region of the adjacent bus bar, and the extension orthogonal plane of each portion in the bent region of the adjacent bus bar is inclined toward a first side of the reference direction or a second side of the reference direction relative to the direction heading toward the bent region of the subject bus bar. Hence, according to this constitution, an interval can be set appropriately between the subject bus bar and the adjacent bus bar in an orthogonal direction to the reference direction, and as a result, the constitution in which none of the extension orthogonal planes of the respective portions of the adjacent bus bar pass through the sensor unit, or the constitution in which an extension orthogonal plane that passes through the sensor unit, from among the extension orthogonal planes of the respective portions of the adjacent bus bar, passes through the sensor unit in the intersecting direction relative to the magnetic field detection direction, can be realized easily.

BRIEF DESCRIPTION OF THE DRAWINGS

FIG. 12 is a perspective view showing a tenth specific example of the arrangement constitution of the current detection apparatus according to this embodiment of the present invention.

DETAILED DESCRIPTION OF EMBODIMENTS

1. Outline

Figure 1:
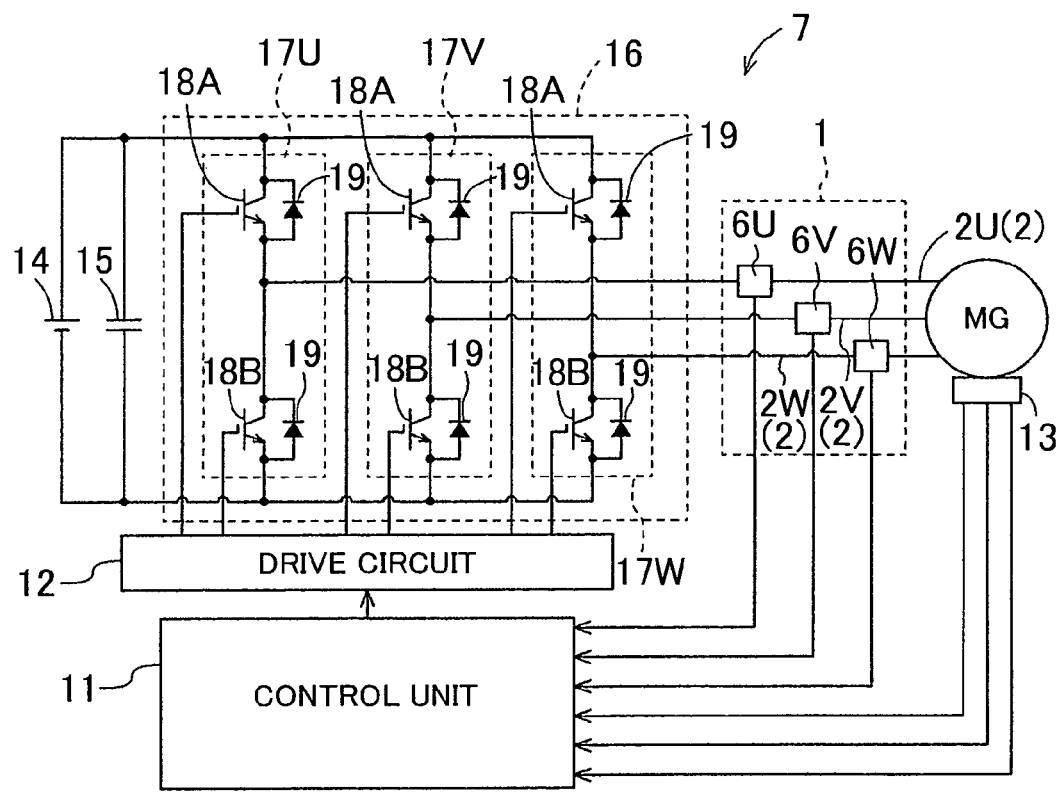
FIG. 1 is a view showing an example of a driving apparatus for a rotary electric machine according to an embodiment of the present invention.

A current detection apparatus 1 according to an embodiment of the present invention will be described below using the drawings. As shown in FIGS. 2 to 12, the current detection apparatus 1 sets at least one of a plurality of bus bars 2 disposed in parallel as a subject bus bar 3, and detects a current I flowing through the subject bus bar 3 on the basis of a magnetic field B generated in the vicinity of the subject bus bar 3. In the current detection apparatus 1, an extension direction L of each portion of an adjacent bus bar 4, which is disposed adjacent to the subject bus bar 3, relative to a sensor unit 6 is set such that none of extension orthogonal planes 5 of each portion of the adjacent bus bar 4 pass through the sensor unit 6 in a parallel direction to a magnetic field detection direction S of the sensor unit 6. According to this constitution, the sensor unit 6 for detecting a magnetic field from the subject bus bar 3 is prevented from detecting a magnetic field from the adjacent bus bar 4, and therefore the sensor unit 6 can detect the magnetic field from the subject bus bar with a high degree of precision. In this embodiment, each bus bar 2 is constituted by a conductive member made of copper or the like and formed in a strip shape having a substantially constant width. The extension direction L of each portion of the bus bar 2 is a parallel direction to a lengthwise direction of each portion of the bus bar 2, and in this embodiment, the extension direction L is parallel to a center line of the bus bar 2. Note that in the following description, the term "bus bar 2" will be used as a comprehensive term denoting both the subject bus bar 3 and the adjacent bus bar 4, and also denoting a U phase bus bar 2U, a V phase bus bar 2V, and a W phase bus bar 2W. Further, the term "sensor unit 6" will be used as a comprehensive term denoting all of a U phase sensor unit 6U, a V phase sensor unit 6V, and a W phase sensor unit 6W.

As shown in FIG. 1, in this embodiment, an example in which the current detection apparatus 1 is applied to a driving apparatus 7 for a rotary electric machine MG driven by a three-phase alternating current will be described. In this case, the current detection apparatus 1 includes three bus bars 2U, 2V, 2W through which current of each phase of the three-phase alternating current for driving the rotary electric machine MG flows. In this embodiment, detection portions 31 (see FIG. 2) are set in all of the three bus bars 2U, 2V, 2W, and sensor units 6U, 6V, 6W are provided in the vicinity of the respective detection portions 31. Here, the subject bus bar 3 denotes a bus bar 2 in which the detection portion 31 is set in a predetermined position and the sensor unit 6 for detecting the magnetic field is provided in the vicinity of the detection portion 31. Hence, in this embodiment, all of the three bus bars 2U, 2V, 2W serve as the subject bus bar 3. When focusing on one of the three bus bars 2U, 2V, 2W as the subject bus bar 3, the bus bar 2 disposed adjacent to the subject bus bar 3 serves as the adjacent bus bar 4.

2. Constitution of Driving Apparatus for Rotary Electric Machine

First, the constitution of the driving apparatus 7 for the rotary electric machine MG to which the current detection apparatus 1 according to this embodiment is applied will be described. The driving apparatus 7 performs drive control on the rotary electric machine MG, which is driven by a three-phase alternating current. As shown in FIG. 1, the driving apparatus 7 includes a control unit 11, a drive circuit 12, a rotation detection device 13, a power supply 14, a smoothing capacitor 15, and a switching unit 16. Here, the power supply 14 is a direct current power supply such as a battery. The driving apparatus 7 converts the direct current of the power supply 14 into a three-phase alternating current of a predetermined frequency and supplies the three-phase alternating current to the rotary electric machine MG. Further, the driving apparatus 7 converts an alternating current generated by the rotary electric machine MG into a direct current and supplies the direct current to the power supply 14 for storage therein. The rotation detection device 13 is constituted by a resolver or the like, and outputs detection signals indicating a rotation speed and a rotation position of the rotary electric machine MG to the control unit 11. The smoothing capacitor 15 is connected in parallel between a positive electrode terminal and a negative electrode terminal of the power supply 14, and functions to smooth a voltage of the power supply 14.

The switching unit 16 includes a U phase arm 17U, a V phase arm 17V and a W phase arm 17W corresponding respectively to the phases (the U phase, V phase and W phase) of the rotary electric machine MG. The arm 17U, 17V, 17W of each phase includes a set of two switching elements constituted by an upper arm element 18A and a lower arm element 18B, which are respectively connected in series. IGBTs (insulated gate bipolar transistors), for example, are used as the switching elements. The U phase arm 17U is connected to a U phase coil of the rotary electric machine MG via the U phase bus bar 2U, the V phase arm 17V is connected to a V phase coil of the rotary electric machine MG via the V phase bus bar 2V, and the W phase arm 17W is connected to a W phase coil of the rotary electric machine MG via the W phase bus bar 2W. Here, the bus bar 2U, 2V, 2W of each phase electrically connects an emitter of the upper arm element 18A and a collector of the lower arm element 18B of the arm 17U, 17V, 17W of each phase to the coil of each phase of the rotary electric machine MG. Further, a collector of the upper arm element 18A of the arm 17U, 17V, 17W of each phase is connected to a high-voltage power supply line connected to the positive electrode terminal of the power supply 14, and an emitter of the lower arm element 18B of the arm 17U, 17V, 17W of each phase is connected to a ground line connected to the negative electrode terminal of the power supply 14. Furthermore, freewheeling diodes 19 are connected in parallel to the respective switching elements 18A, 18B.

The switching unit 16 is connected to the control unit 11 via the drive circuit 12. When the switching elements 18A, 18B are operated in accordance with a gate signal that is output from the drive circuit 12 in accordance with a control signal from the control unit 11, the switching unit 16 converts direct current power from the power supply 14 into three-phase alternating current power having a predetermined frequency and a predetermined current value and supplies the three-phase alternating current power to the rotary electric machine MG, or converts three-phase alternating current power generated by the rotary electric machine MG into direct current power and supplies the direct current power to the power supply 14. As a result, the rotary electric machine MG is driven at a predetermined output torque and a predetermined rotation speed.

A current value flowing through the bus bar 2U, 2V, 2W of each phase, which is provided between the arm 17U, 17V, 17W of each phase in the switching unit 16 and the coil of each phase in the rotary electric machine MG, is detected by the current detection apparatus 1. In this embodiment, the sensor unit 6 is disposed in relation to all of the three bus bars 2U, 2V, 2W of the current detection apparatus 1. In other words, the current detection apparatus 1 includes the U phase sensor unit 6U for detecting the current of the U phase bus bar 2U, the V phase sensor unit 6V for detecting the current of the V phase bus bar 2V, and the W phase sensor unit 6W for detecting the current of the W phase bus bar 2W. The sensor unit 6U, 6V, 6W of each phase detects a magnetic flux of a magnetic field generated by the current flowing through the detection subject bus bar 2U, 2V, 2W of each phase, and outputs a detection signal corresponding to the magnetic flux density of the detected magnetic field. The magnetic flux density of the magnetic field generated by the current flowing through the bus bar 2 is proportional to the magnitude of the current flowing through the bus bar 2. Therefore, the value of the current flowing through the bus bar 2U, 2V, 2W of each phase can be detected by the sensor unit 6U, 6V, 6W of each phase. The current value detection signal is output by the sensor unit 6U, 6V, 6W of each phase to the control unit 11. In addition to the current value detection signal output by the sensor unit 6U, 6V, 6W of each phase of the current detection apparatus 1, a detection signal indicating the rotation speed of the rotary electric machine MG detected by the rotation detection device 13 is input into the control unit 11. The control unit 11 controls the switching unit 16 by outputting a control signal to the drive circuit 12 on the basis of these detection signals.

3. Constitution of Sensor Unit

Figure 2:
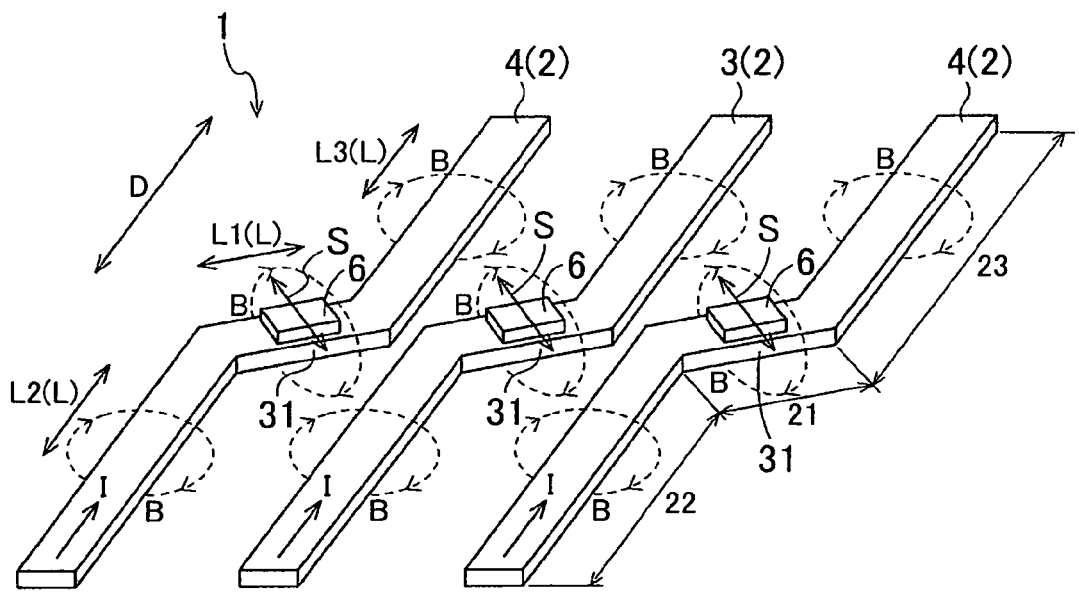
FIG. 2 is a perspective view showing a first specific example of an arrangement constitution of a current detection apparatus according to an embodiment of the present invention.

Next, the arrangement of the sensor units 6U, 6V, 6W of the respective phases relative to the bus bars 2U, 2V, 2W of the respective phases and the constitution of the sensor units 6U, 6V, 6W of the respective phases will be described. Note that these constitutions are identical in all phases, and therefore the terms "bus bar 2" and "sensor unit 6" will be used here. Each sensor unit 6 is constituted by a coreless magnetic field detection sensor not having a flux concentration core. This type of magnetic field detection sensor is formed using various magnetic detection elements, for example, a Hall element, an MR (magneto-resistance effect) element, and an MI (magnetic impedance) element. In this embodiment, as shown in FIG. 2, the magnetic field detection sensor is a coreless sensor in which the magnetic detection elements are disposed in the vicinity of the bus bar 2 without a flux concentration core around the magnetic detection elements. As well as not having a flux concentration core, the sensor unit 6 also does not include a shield against an external magnetic field other than the magnetic field B generated by the detection subject bus bar 2 (the subject bus bar 3). Although not shown in FIG. 2 and so on, the sensor unit 6 includes a substrate and so on which drive the magnetic detection elements and are connected to an output signal line. Thus, the sensor unit 6 is formed to detect only the magnetic field B oriented in the predetermined magnetic field detection direction S. Here, the magnetic field detection direction S is parallel to a single straight line and includes both a direction heading toward one end side of the straight line and a direction heading toward the other end side of the straight line.

As shown in FIG. 2, each sensor unit 6 has a single bus bar 2 as a detection subject, and in order to detect the current I flowing through the bus bar 2, the sensor unit 6 detects the magnetic field B in the vicinity of the bus bar 2, which is generated as the current I flows through the bus bar 2. For this purpose, the sensor unit 6 is disposed in the vicinity of the bus bar 2. At this time, the portion of the bus bar 2 that is closest to the sensor unit 6 serves as the detection portion 31. The sensor unit 6 is disposed either in contact with the detection portion 31 of the bus bar 2 or disposed away from the detection portion 31 by a predetermined distance. Further, the sensor unit 6 is disposed such that the magnetic field detection direction S is substantially orthogonal to the extension direction L of the bus bar 2 at the detection portion 31. In this embodiment in particular, the direction in which the sensor unit 6 is disposed is set such that the magnetic field detection direction S of the sensor unit 6 is precisely orthogonal to the extension direction L of the bus bar 2 at the detection portion 31. Note that when the sensor unit 6 is disposed away from the detection portion 31 of the bus bar 2 by a predetermined distance, the predetermined distance is set within a distance range in which the magnetic field generated by the subject bus bar 2 can be detected by the sensor unit 6.

4. Arrangement Constitution of Bus Bars

Next, the arrangement constitution of the plurality of bus bars 2 relative to the sensor units 6 will be described. As described above, each of the sensor units 6U, 6V, 6W of the current detection apparatus 1 detects the magnetic flux of the magnetic field B generated as the current I flows through the detection subject bus bar 2U, 2V, 2W of each phase. At this time, the bus bars 2U, 2V, 2W of the respective phases are disposed parallel to each other, and therefore the sensor unit 6 of one phase may detect not only the magnetic flux of the magnetic field B generated by the bus bar 2 of the corresponding phase but also the magnetic flux of the magnetic field B generated by the bus bar 2 of another phase. For example, when the V phase bus bar 2V is disposed so as to be sandwiched between the U phase bus bar 2U and the W phase bus bar 2W, the V phase sensor unit 6V, which is supposed to detect only magnetic flux from the V phase bus bar 2V, may also detect magnetic flux from the U phase bus bar 2U and the W phase bus bar 2W. In this case, the current value of the V phase bus bar 2V detected by the V phase sensor unit 6V includes an error caused by detection of the magnetic flux of the magnetic fields B generated respectively by the U phase bus bar 2U and the W phase bus bar 2W. To increase the precision of detecting the current values by the respective sensor units 6U, 6V, 6W, a constitution that makes it difficult for each of the bus bars 2 to be affected by the magnetic field B of the adjacent bus bar 2 of the each bus bar 2 need be provided.

Hence, in the current detection apparatus 1, by setting the extension direction of each portion of the bus bars 2U, 2V, 2W of the respective phases relative to the arrangement and direction of the respective sensor unit 6U, 6V, 6W appropriately, situations in which the respective sensor units 6U, 6V, 6W detect the magnetic field B from the adjacent bus bar 2 other than the detection subject bus bar 2 can be suppressed, allowing the magnetic field B of the detection subject bus bar 2 to be detected with a high degree of precision. This setting of the extension direction of each portion of the bus bar 2 relative to the sensor unit 6 in order to realize high precision detection of the magnetic field B is the main feature of the present invention. Note that the following description does not particularly relate to differences among the U phase bus bar 2U, V phase bus bar 2V and W phase bus bar 2W, and therefore the bus bars 2U, 2V, 2W will simply be described as three bus bars 2 disposed in parallel. Each of the three bus bars 2 is provided with the sensor unit 6, and may therefore serve as the subject bus bar 3. However, to avoid complexity, the following description basically focuses on the case where the bus bar 2 disposed in the center of the three bus bars 2 is set as the subject bus bar 3 while the two bus bars 2 disposed adjacent to the central subject bus bar 3 on both sides thereof are set as the adjacent bus bars 4.

First, a basic condition (which will be hereinafter referred to as an "extension direction setting condition") for setting the extension direction L of each portion of each bus bar 2 relative to the sensor unit 6 will be described. Specific examples of arrangement constitutions of the bus bars 2 shown in FIGS. 3 to 12 are all set to satisfy the extension direction setting condition. Note that FIG. 2 is a perspective view showing an identical arrangement constitution of the bus bars 2 to FIG. 3. The extension direction setting condition will be described below with reference to the plurality of examples shown in these drawings. From among FIGS. 3 to 12, FIGS. 3 to 11 show the extension orthogonal plane 5 of each portion of the adjacent bus bar 4 using broken lines. Here, the extension orthogonal plane 5 is an orthogonal plane to the extension direction L of each portion of the bus bar 2. Every portion of the bus bar 2 in the extension direction L (a lengthwise direction) has an extension orthogonal plane 5. The magnetic flux of the magnetic field B generated from each portion of the bus bar 2 when the current I is passed through the bus bar 2 basically passes through the extension orthogonal plane 5 of each portion. To avoid complication, only the extension orthogonal planes 5 of the adjacent bus bars 4 disposed on both sides of the central subject bus bar 3 are shown in FIGS. 3 to 11. Moreover, specific portions in the extension direction L of the adjacent bus bar 4 are selected at fixed intervals, and only the extension orthogonal planes 5 of these portions are shown in the drawings. FIGS. 2 to 12 show examples in which the bus bar 2 is formed in a strip shape having a substantially constant width. However, the shape of an orthogonal cross-section of the bus bar 2 to the extension direction L does not relate to setting of the extension direction L of each portion of the bus bar 2 relative to the sensor unit 6. Therefore, in FIGS. 3 to 11, the arrangement of the bus bars 2 is expressed by center lines alone.

The arrangement constitution of the bus bars 2 according to the present invention for satisfying the extension direction setting condition is as follows. When the bus bar 2 disposed adjacent to the subject bus bar 3 is set as the adjacent bus bar 4, the adjacent bus bar 4 is set such that none of the extension orthogonal planes 5 of the respective portions of the adjacent bus bar 4 pass through the sensor unit 6 in a parallel direction to the magnetic field detection direction S of the sensor unit 6. In other words, the extension orthogonal planes 5 of the respective portions of the adjacent bus bar 4 relative to the sensor unit 6 are set such that none of the extension orthogonal planes 5 of the respective portions of the adjacent bus bar 4 pass through the sensor unit 6 or such that the extension orthogonal planes 5 that pass through the sensor unit 6, from among the extension orthogonal planes 5 of the respective portions of the adjacent bus bar 4, pass through the sensor unit 6 in an intersecting direction relative to the magnetic field detection direction S.

Figure 3:
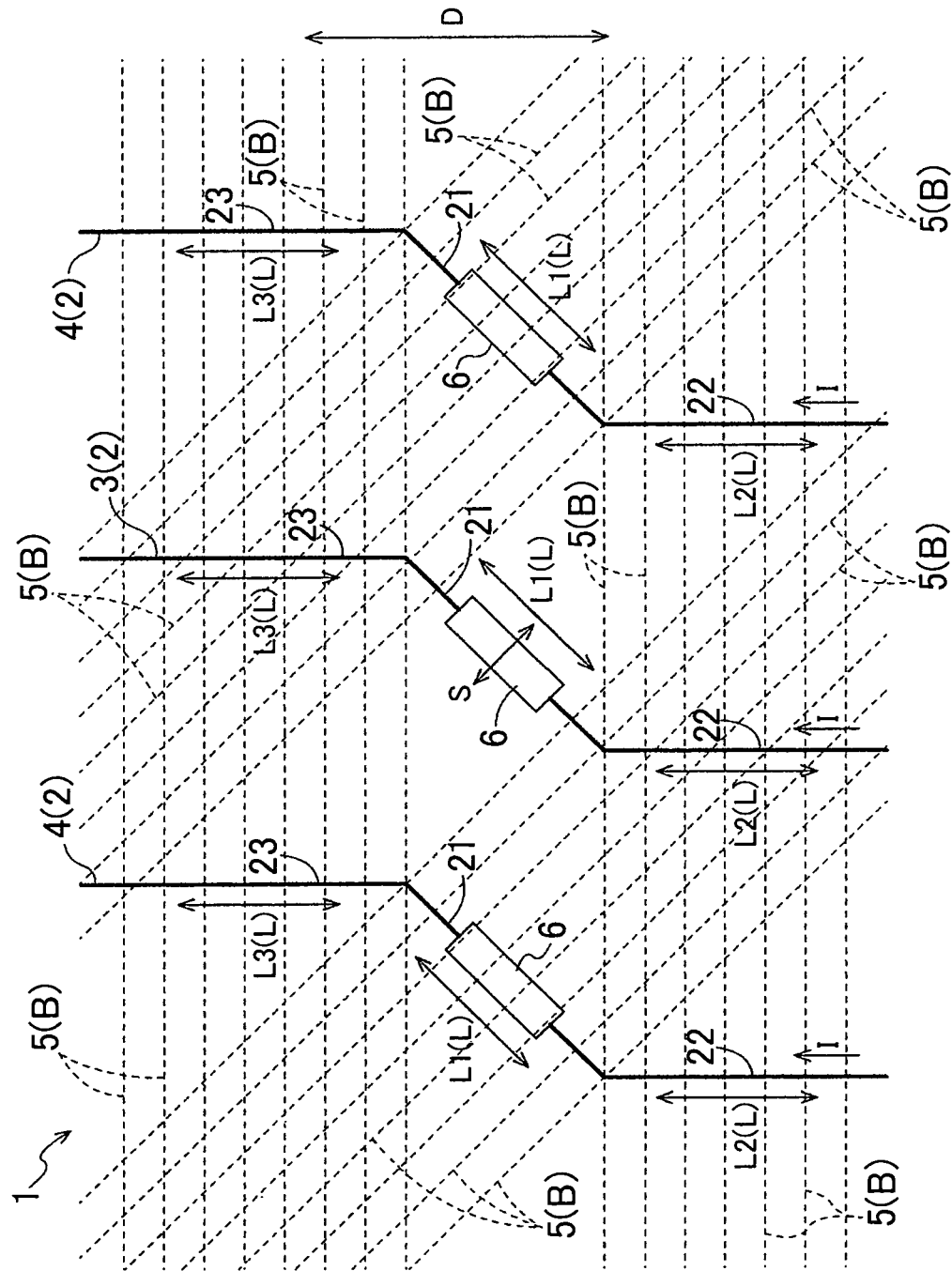
FIG. 3 is a schematic plan view showing the first specific example of the arrangement constitution of the current detection apparatus according to this embodiment of the present invention.
Figure 4:
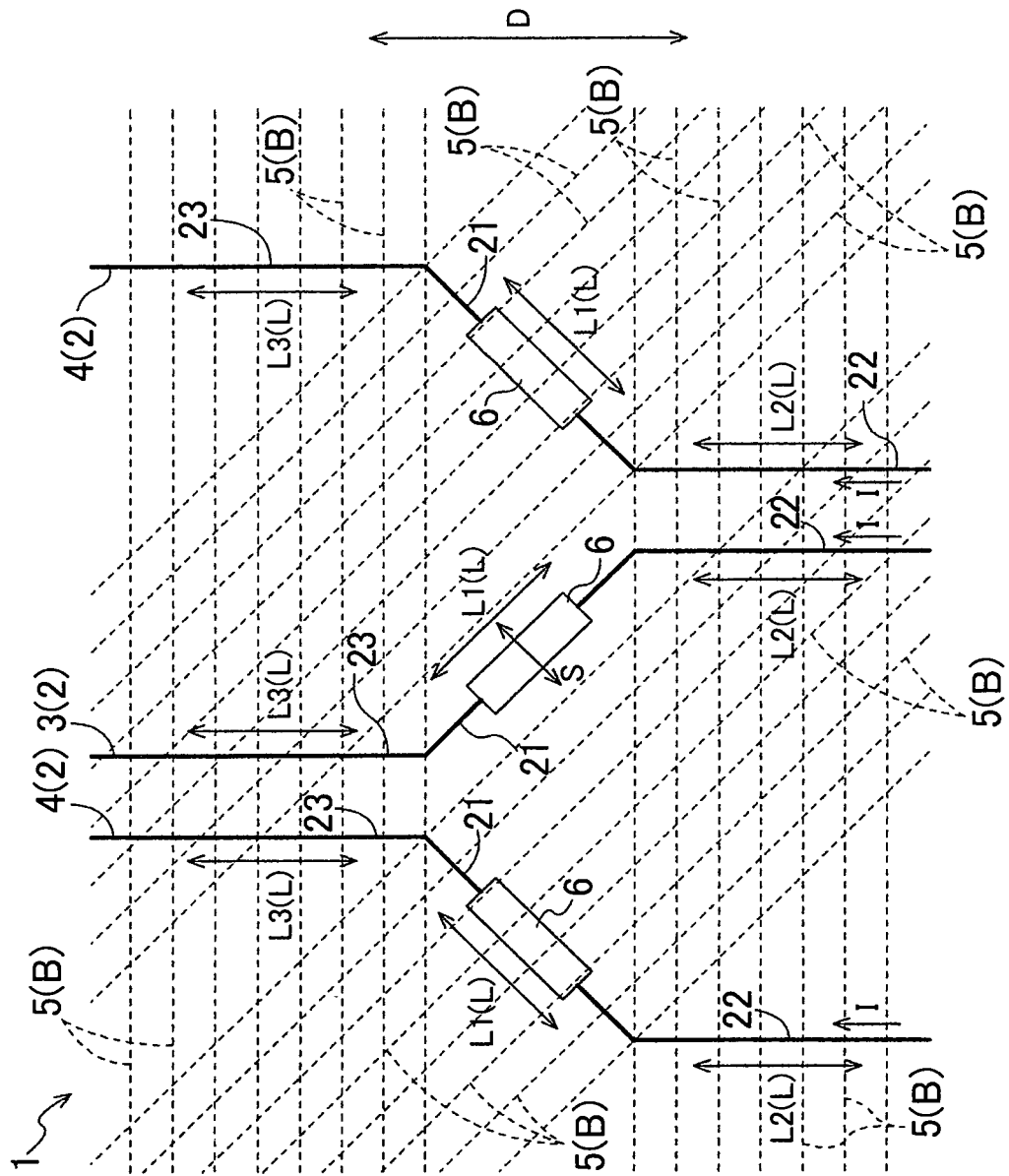
FIG. 4 is a schematic plan view showing a second specific example of the arrangement constitution of the current detection apparatus according to this embodiment of the present invention.
Figure 5:
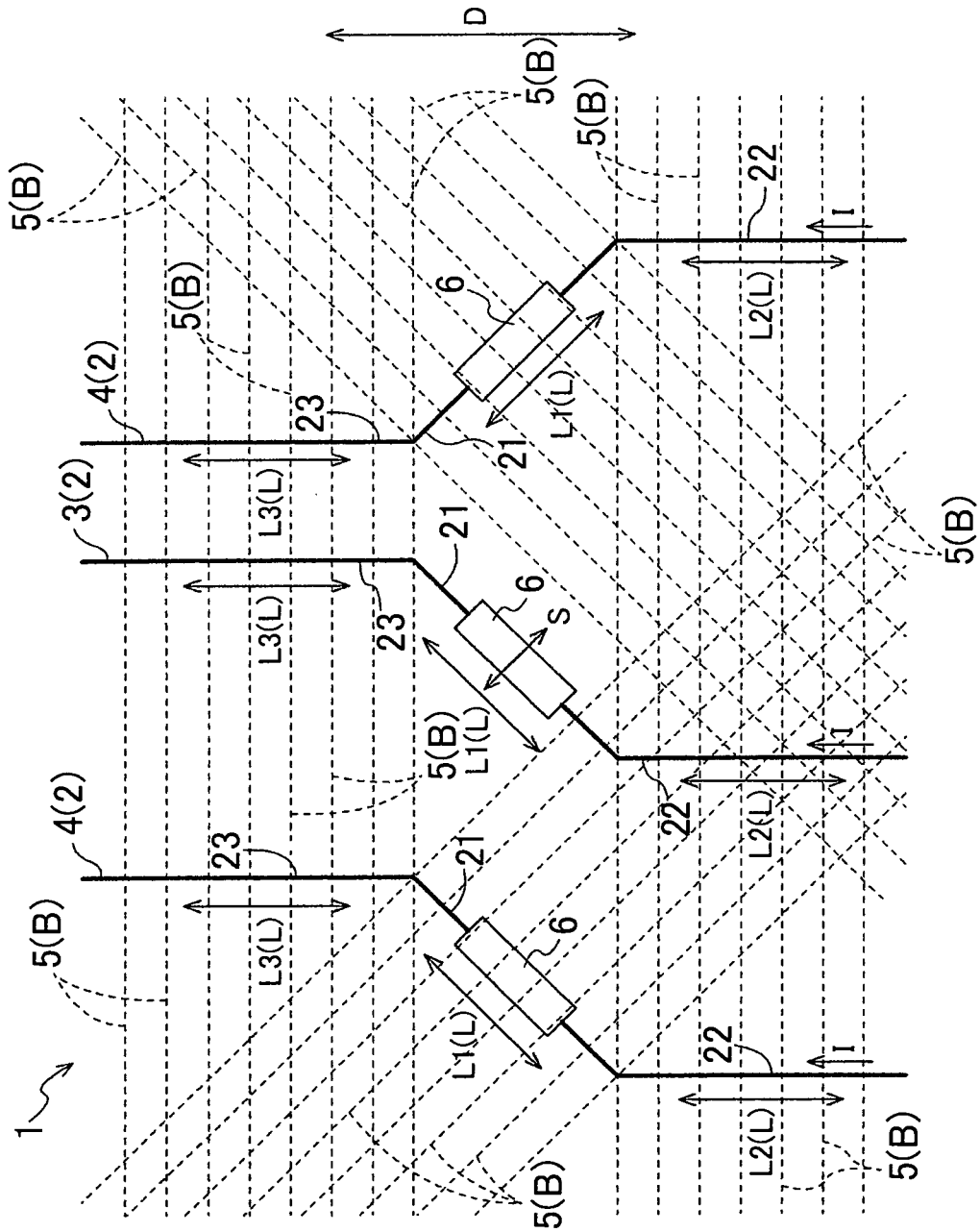
FIG. 5 is a schematic plan view showing a third specific example of the arrangement constitution of the current detection apparatus according to this embodiment of the present invention.

Specific examples of the setting in which none of the extension orthogonal planes 5 of the respective portions of the adjacent bus bar 4 pass through the sensor unit 6 correspond to the examples shown in FIGS. 3 to 5. On the other hand, specific examples of the setting in which the extension orthogonal planes 5 that pass through the sensor unit 6, from among the extension orthogonal planes 5 of the respective portions of the adjacent bus bar 4, passes through the sensor unit 6 in the intersecting direction relative to the magnetic field detection direction S correspond to the examples shown in FIGS. 6 to 12. Further, the constitution in which the extension orthogonal planes 5 of the respective portions of the adjacent bus bar 4 pass through the sensor unit 6 in the intersecting direction relative to the magnetic field detection direction S is preferably set such that the extension orthogonal planes 5 that pass through the sensor unit 6 pass through the sensor unit 6 in the substantially orthogonal direction to the magnetic field detection direction S. Specific examples of this constitution are shown in FIGS. 6 to 8 and FIG. 12.

Further, in this embodiment, a basic arrangement direction of the plurality of (three here) bus bars 2 disposed in parallel follows a predetermined reference direction D. Each of the plurality of bus bars 2 includes a first side parallel region 22 that is provided on a first side of the reference direction D and has a parallel extension direction L2 to the reference direction D, and a second side parallel region 23 that is provided on a second side of the reference direction D relative to the first side parallel region 22 and has a parallel extension direction L3 to the reference direction D. Furthermore, at least one of the plurality of bus bars 2 has a bent region 21 which is provided between the first side parallel region 22 and the second side parallel region 23 and has an extension direction L1 that is different from the reference direction D. In the examples shown in FIGS. 3 to 9 and FIG. 12, all of the plurality of (three) bus bars 2 include the bent region 21. In the bus bar 2 having the bent region 21, a region on a first side of the bent region 21 in the reference direction D is set as the first side parallel region 22 and a region on a second side of the bent region 21 in the reference direction D is set as the second side parallel region 23. In the examples shown in FIGS. 10 and 11, only a part (two or one) of the plurality of (three) bus bars 2 includes the bent region 21. In these examples, the bus bars 2 not having the bent region 21 take a rectilinear shape parallel to the reference direction D. In these rectilinear bus bars 2, the boundary between the first side parallel region 22 and second side parallel region 23 is unclear, but in this embodiment, it is assumed for convenience that a region on a first side of the detection portion 31 used by the sensor unit 6 in the reference direction D is the first side parallel region 22 and a region on a second side of the detection portion 31 in the reference direction D is the second side parallel region 23. Although not shown in the drawings, when the bus bar 2 does not include the detection portion 31 used by the sensor unit 6, a portion corresponding to the detection portion 31 of another bus bar 2 disposed in parallel may be set as the boundary between the first side parallel region 22 and the second side parallel region 23.

Furthermore, in this embodiment, when the bus bar 2 includes the bent region 21, the detection portion 31 used by the sensor unit 6 is set within the bent region 21. As described above, all of the bus bars 2 provided with the sensor unit 6 serve as the subject bus bar 3. Hence, in the examples shown in FIGS. 3 to 9 and FIG. 12, the bent region 21 is provided between the first side parallel region 22 and the second side parallel region 23 in all of the plurality of (three) subject bus bars 3, and the detection portion 31 used by the sensor unit 6 is provided in the bent region 21.

Further, the arrangement constitution of the plurality of bus bars 2 is not limited to the constitution in which the center lines of the plurality of bus bars 2 are coplanar, and the constitution in which the center lines of the plurality of bus bars 2 are disposed three-dimensionally may also be employed favorably. FIGS. 3 to 11 show examples in which the center lines of the plurality of bus bars 2 are coplanar, while FIG. 12 shows an example in which the (center lines of the) plurality of bus bars 2 are disposed three-dimensionally. Note that the constitution in which the center lines of the plurality of bus bars 2 are coplanar includes the constitution in which the width directions of the strip-shaped bus bars 2 are disposed parallel to the plane, as shown in FIG. 2, the constitution in which the width directions of the strip-shaped bus bars 2 are disposed in an intersecting direction (an orthogonal direction, for example) to the plane, and so on.

5. Description of Specific Examples

Specific examples of arrangement constitutions of the bus bars 2 for satisfying the extension direction setting condition will now be described in sequence using FIGS. 2 to 12.

5-1 First Specific Example

First, a first specific example will be described using FIGS. 2 and 3. In this example, all of the three bus bars 2 include bent regions 21 having identical extension directions L1. More specifically, in all of the three bus bars 2, the extension directions L1 of the respective bent regions 21 incline rightward (rightward in FIG. 3) from the first side to the second side of the reference direction D relative to the reference direction D by an identical angle. In this example, as shown clearly in FIG. 3, the extension direction L1 of the bent region 21 is set to incline 45° relative to the reference direction D. Note that this incline angle relative to the reference direction D is just an example, and the incline angle relative to the reference direction D may be set appropriately within a range of 5° to 85°, or preferably 30° to 80°, for example.

At this time, the bent regions 21 of the two adjacent bus bars 4 disposed on both sides of the central subject bus bar 3 are disposed so as not to overlap the sensor unit 6 provided on the subject bus bar 3 in the extension direction L1 of the bent region 21. In other words, the sensor unit 6 of the subject bus bar 3 and the bent regions 21 of the two adjacent bus bars 4 are disposed such that no parts thereof are provided in identical positions (overlapping positions) on a parallel coordinate axis to the extension direction L1. Thus, the bus bars 2 can be set such that none of the extension orthogonal planes 5 of the respective portions in the bent regions 21 of the adjacent bus bars 4 pass through the sensor unit 6. Furthermore, in this example, the respective first side parallel regions 22 and second side parallel regions 23 of the adjacent bus bars 4 are disposed so as not to overlap the sensor unit 6 of the subject bus bar 3 in the reference direction D. In other words, the sensor unit 6 of the subject bus bar 3 and the first side parallel regions 22 and second side parallel regions 23 of the two adjacent bus bars 4 are disposed such that no parts thereof are provided in identical positions (overlapping positions) on a parallel coordinate axis to the reference direction D. Thus, the bus bars 2 can be set such that none of the extension orthogonal planes 5 of the respective portions in the respective first side parallel regions 22 and second side parallel regions 23 of the adjacent bus bars 4 pass through the sensor unit 6 of the subject bus bar 3. Hence, in this example, the adjacent bus bars 4 are constituted entirely such that none of the extension orthogonal planes 5 of the respective portions of the adjacent bus bars 4 pass through the sensor unit 6 of the subject bus bar 3.

Furthermore, in this example, none of the extension orthogonal planes 5 of the respective portions in the respective first side parallel regions 22 and second side parallel regions 23 of the adjacent bus bars 4 pass through the bent region 21 of the subject bus bar 3. This constitution is realized by setting the lengths of all of the bent regions 21 of the three bus bars 2 to be identical and arranging the respective bent regions 21 of the three bus bars 2 in identical positions in the reference direction D. Moreover, in this example, the three bus bars 2 are formed from identically shaped members. Hence, a plurality of types of bus bars 2 having different shapes need not be used to realize the arrangement constitution of the bus bars 2 described above, and as a result, the current detection apparatus 1 can be constructed at a comparatively low cost.

With the arrangement constitution of the bus bars 2 according to this example, the bus bars 2 can be set such that none of the extension orthogonal planes 5 of the respective portions of the adjacent bus bars 4 pass through the sensor unit 6 provided on the subject bus bar 3. In other words, with the constitution of this example, the extension orthogonal planes 5 of the respective bus bars 2 relative to the sensor unit 6 provided on the subject bus bar 3 are set such that the sensor unit 6 is disposed in a region where the extension orthogonal planes 5 of the respective portions of the adjacent bus bars 4 do not exist. As described above, the magnetic flux of the magnetic field B generated from each portion of the adjacent bus bar 4 when the current I is passed through the adjacent bus bar 4 basically passes through the extension orthogonal plane 5 of each portion. Therefore, with the constitution according to this example, the magnetic flux of the magnetic field B generated from each portion of the adjacent bus bar 4 basically never passes through the sensor unit 6 of the subject bus bar 3. As a result, situations in which the magnetic field B of the adjacent bus bar 4 is detected by the sensor unit 6 can be suppressed greatly, and the magnetic field B generated by the subject bus bar 3 can be detected by the sensor unit 6 with a high degree of precision. Accordingly, the current I flowing through the subject bus bar 3 can be detected with a high degree of precision.

The case where the bus bar 2 disposed in the center of the three bus bars 2 is set as the subject bus bar 3 has been described above. However, when one of the two remaining bus bars 2 is set as the subject bus bar 3 and the central bus bar 2 disposed adjacent to the subject bus bar 3 is set as the adjacent bus bar 4, the relationship between the extension orthogonal plane 5 of each portion of the adjacent bus bar 4 and the sensor unit 6 or the bent region 21 of the subject bus bar 3 is similar to the relationship described above. In other words, with this example, none of the extension orthogonal planes 5 of the respective portions of the adjacent bus bar 4 pass through the sensor unit 6 provided on the subject bus bar 3 regardless of which of the three bus bars 2 provided with the sensor units 6 is set as the subject bus bar 3. Hence, with the constitution according to this example, the magnetic flux of the magnetic field B generated from each portion of the adjacent bus bar 4 basically never passes through the sensor unit 6 of each of the three bus bars 2. As a result, the magnetic field B generated by the three bus bars 2 can be detected with a high degree of precision, enabling high precision detection of the current I flowing through each bus bar 2.

Note that in this example, the extension directions L1 of the bent regions 21 provided in all of the three bus bars 2 are set to incline by an identical incline angle (45° in this example) to the reference direction D. However, the incline angles of the extension directions L1 of all or a part of the three (plurality of) bent regions 21 relative to the reference direction D may be set at different angles.

5-2 Second Specific Example

Next, a second specific example will be described using FIG. 4. The arrangement constitution of the bus bars 2 according to this example differs from the first specific example described above in that the bent regions 21 of two adjacent bus bars 2 of the three bus bars 2 have different extension directions L1. Here, the extension direction L1 of the bent region 21 provided in one of the three bus bars 2 differs from the extension directions L1 of the bent regions 21 provided in the other two bus bars 2. In this example, the extension direction L1 of the bent region 21 in the central bus bar 2 of the three bus bars 2 disposed in parallel differs from the extension directions L1 of the other two bus bars 2. More specifically, in the bent region 21 of the central bus bar 2, the extension direction 21 inclines leftward (leftward in FIG. 4) from the first side to the second side of the reference direction D, and in the bent regions 21 of the two bus bars 2 provided on both sides of the central bus bar 2, the extension directions L1 incline rightward (rightward in FIG. 4) from the first side to the second side of the reference direction D at identical angles relative to the reference direction D. The extension directions L1 of the bent regions 21 of the three bus bars 2 are all set to incline 45° relative to the reference direction D. Similarly to the first specific example described above, this incline angle relative to the reference direction D is just an example, and the incline angle relative to the reference direction D may be set appropriately within a range of 5° to 85°, or preferably 30° to 80°, for example.

Otherwise, the second specific example is constituted basically identically to the first specific example. Hence, regardless of which of the three bus bars 2 is set as the subject bus bar 3, the bent region 21 of the adjacent bus bar 4 disposed adjacent to the subject bus bar 3 is set not to overlap the sensor unit 6 provided on the subject bus bar 3 in the extension direction L1 of the bent region 21. Further, the first side parallel region 22 and second side parallel region 23 of the adjacent bus bar 4 is disposed not to overlap the sensor unit 6 of the subject bus bar 3 in the reference direction D. Accordingly, in this constitution also, the adjacent bus bar 4 is formed entirely such that none of the extension orthogonal planes 5 of the respective portions of the adjacent bus bar 4 pass through the sensor unit 6 of the subject bus bar 3. Furthermore, in this example also, the lengths of all of the bent regions 21 of the three bus bars 2 are set to be identical and the respective bent regions 21 of the three bus bars 2 are disposed in identical positions in the reference direction D. Further, the three bus bars 2 are formed from identically shaped members having different arrangement directions. In this example, similarly to the first specific example described above, the magnetic flux of the magnetic field B generated from each portion of the adjacent bus bar 4 basically never passes through the sensor units 6 of all of the three bus bars 2. Therefore, the magnetic field B generated by each of the three bus bars 2 can be detected with a high degree of precision, enabling high precision detection of the current I flowing through each bus bar 2.

Note that in this example, the extension directions L1 of the bent regions 21 provided in the respective three bus bars 2 are set to incline by an identical incline angle (45° in this example) to the reference direction D. However, the incline angles of the extension directions L1 of all or a part of the three (plurality of) bent regions 21 relative to the reference direction D may be set at different angles.

5-3 Third Specific Example

Next, a third specific example will be described using FIG. 5. The arrangement constitution of the bus bars 2 according to this example differs from the second specific example described above in that in this example, the extension direction L1 of the bent region 21 in one of the three bus bars 2 other than the central bus bar 2 differs from the extension directions L1 of the bent regions 21 in the other two bus bars 2, compared to the second specific example in which the extension direction L1 of the bent region 21 in the central bus bar 2 differs from the extension directions L1 of the bent regions 21 in the other two bus bars 2. In other words, in this example, the extension direction L1 of the bent region 21 in the bus bar 2 that is disposed on the right side (the right side in FIG. 5) from the first side to the second side of the reference direction D, from among the three bus bars 2 disposed in parallel, differs from the extension directions L1 of the bent regions 21 in the other two bus bars 2. More specifically, in the bent region 21 of the right side bus bar 2, the extension direction L1 inclines leftward (leftward in FIG. 5) from the first side to the second side of the reference direction D. On the other hand, in the bent regions 21 of the central and left side bus bars 2, the extension directions L1 incline rightward from the first side to the second side of the reference direction D by identical angles relative to the reference direction D. The extension directions L1 of the bent regions 21 in the three bus bars 2 are all set to incline 45° relative to the reference direction D. Similarly to the first specific example described above, this incline angle relative to the reference direction D is just an example, and the incline angle relative to the reference direction D may be set appropriately within a range of 5° to 85°, or preferably 30° to 80°, for example.

Otherwise, the third specific example is constituted basically identically to the first and second specific examples described above. Accordingly, similar actions and effects to the first and second specific examples can be obtained with the constitution of this example.

Note that in this example, the extension directions L1 of the bent regions 21 provided in each of the three bus bars 2 are set to incline by an identical incline angle (45° in this example) to the reference direction D. However, the incline angles of the extension directions L1 of all or a part of the three (plurality of) bent regions 21 relative to the reference direction D may be set at different angles.

5-4 Fourth Specific Example

Figure 6:
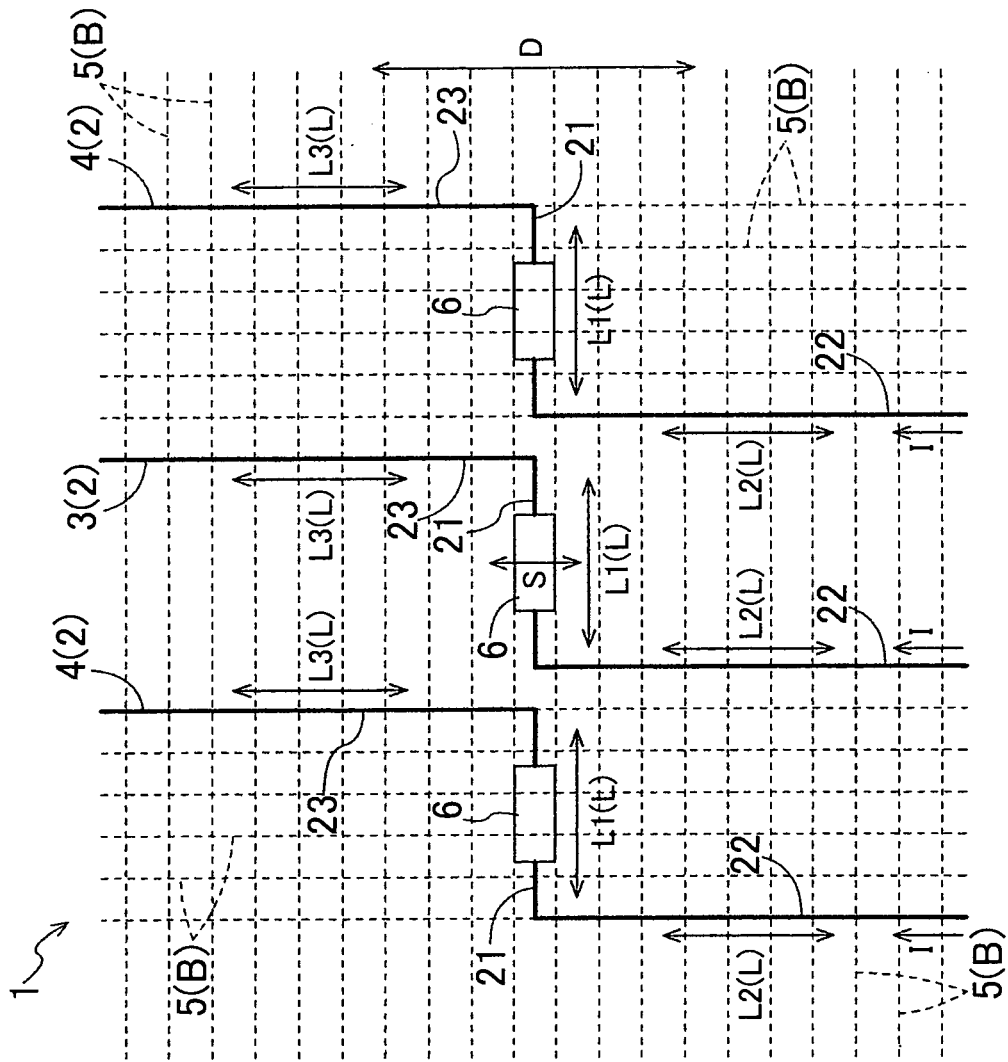
FIG. 6 is a schematic plan view showing a fourth specific example of the arrangement constitution of the current detection apparatus according to this embodiment of the present invention.

Next, a fourth specific example will be described using FIG. 6. The arrangement constitution of the bus bars 2 according to this example is similar to the first specific example described above in that all of the three bus bars 2 include bent regions 21 having identical extension directions L1, but differs from the first specific example in that the extension direction L1 of each bent region 21 is set to be substantially orthogonal to the reference direction D. More specifically, all of the three bus bars 2 are bent rightward (rightward in FIG. 6) from the first side to the second side of the reference direction D at a right angle to the reference direction D such that the extension direction L1 of the bent region 21 is orthogonal to the reference direction D. Note that in this example, the extension direction L1 of the bent region 21 is set to be precisely orthogonal to the reference direction D.

Further, the bent regions 21 of the two adjacent bus bars 4 disposed on both sides of the central subject bus bar 3 are disposed so as not to overlap the sensor unit 6 provided on the subject bus bar 3 in an orthogonal direction to the reference direction D, i.e. the extension direction L1 of the bent region 21. In other words, the sensor unit 6 of the subject bus bar 3 and the bent regions 21 of the two adjacent bus bars 4 are disposed such that no parts thereof are provided in identical positions (overlapping positions) on a parallel coordinate axis to the extension direction L1. Thus, the bus bars 2 can be set such that none of the extension orthogonal planes 5 of the respective portions in the bent regions 21 of the adjacent bus bars 4 pass through the sensor unit 6. Hence, with the constitution according to this example, only the extension orthogonal planes 5 of the respective portions in the first side parallel region 22 and second side parallel region 23 of the adjacent bus bar 4 pass through the sensor unit 6. As described above, the magnetic field detection direction S of the sensor unit 6 provided on the subject bus bar 3 is orthogonal to the extension direction L1 of the bent region 21, and therefore the extension orthogonal planes 5 of the respective portions of the first side parallel region 22 and second side parallel region 23 extend in an orthogonal direction to the magnetic field detection direction S of the sensor unit 6. Hence, in this example, the extension orthogonal planes 5 that pass through the sensor unit 6 of the subject bus bar 3, from among the extension orthogonal planes 5 of the respective portions of the adjacent bus bar 4, pass through the sensor unit 6 in the substantially orthogonal direction to the magnetic field detection direction S.

Therefore, with the arrangement constitution of the bus bars 2 according to this example, the magnetic flux of the magnetic field B generated from each portion of the adjacent bus bar 4 also basically passes through the sensor unit 6 of the subject bus bar 3 in the substantially orthogonal direction to the magnetic field detection direction S of the sensor unit 6. As described above, the sensor unit 6 is constituted to detect only the magnetic field B generated in the magnetic field detection direction S and to detect only a vector component, in the magnetic field detection direction S, of the magnetic field B generated in the intersecting direction to the magnetic field detection direction S. Hence, with the constitution according to this example, the vector component, in the magnetic field detection direction S, of the magnetic field B generated by the adjacent bus bar 4 and detected by the sensor unit 6 of the subject bus bar 3 is basically zero. Accordingly, situations in which the magnetic field B of the adjacent bus bar 4 is detected by the sensor unit 6 can be greatly suppressed, and as a result, the magnetic field B generated by the subject bus bar 3 can be detected by the sensor unit 6 with a high degree of precision. As a result, the current I flowing through the subject bus bar 3 can be detected with a high degree of precision.

Furthermore, in this example, the lengths of all of the bent regions 21 of the three bus bars 2 are set to be identical and the respective bent regions 21 of the three bus bars 2 are disposed in identical positions in the reference direction D. Therefore, with the constitution according to this example, the three bus bars 2 can easily be formed from identically shaped members. When the three bus bars 2 are formed from identically shaped members, a plurality of types of bus bars 2 having different shapes need not be used to realize the arrangement constitution of the bus bars 2 described above, and as a result, the current detection apparatus 1 can be constructed at a comparatively low cost.

The case where the bus bar 2 disposed in the center of the three bus bars 2 is set as the subject bus bar 3 has been described above. However, when one of the two remaining bus bars 2 is set as the subject bus bar 3 and the central bus bar 2 disposed adjacent to the subject bus bar 3 is set as the adjacent bus bar 4, the relationship between the extension orthogonal plane 5 of each portion of the adjacent bus bar 4 and the sensor unit 6 or the bent region 21 of the subject bus bar 3 is similar to the relationship described above. In other words, with this example, the extension orthogonal planes 5 that pass through the sensor unit 6 of the subject bus bar 3, from among the extension orthogonal planes 5 of the respective portions of the adjacent bus bar 4, pass through the sensor unit 6 in the substantially orthogonal direction to the magnetic field detection direction S regardless of which of the three bus bars 2 provided with the sensor units 6 is set as the subject bus bar 3. Hence, with the constitution according to this example, the extension orthogonal planes 5 that pass through all of the sensor units 6 of the three bus bars 2, from among the extension orthogonal planes 5 of the respective portions of the adjacent bus bar 4, pass through the sensor units 6 in the substantially orthogonal direction to the magnetic field detection direction S. As a result, the magnetic field B generated by each of the three bus bars 2 can be detected with a high degree of precision, enabling high precision detection of the current I flowing through each bus bar 2.

Note that in this example, the extension directions L1 of the bent regions 21 provided in each of the three bus bars 2 are set to be precisely orthogonal to the reference direction D. However, the incline angle relative to the reference direction D does not have to be set at precisely 90°, and may be set appropriately within a range of 85° to 95° relative to the reference direction D, for example. Further, the extension directions L1 of the bent regions 21 in all of the three bus bars 2 need not be identical, and the incline angles of the extension directions L1 of a part or all of the three (plurality of) bent regions 21 relative to the reference direction D may be set at different angles.

5-5 Fifth Specific Example

Figure 7:
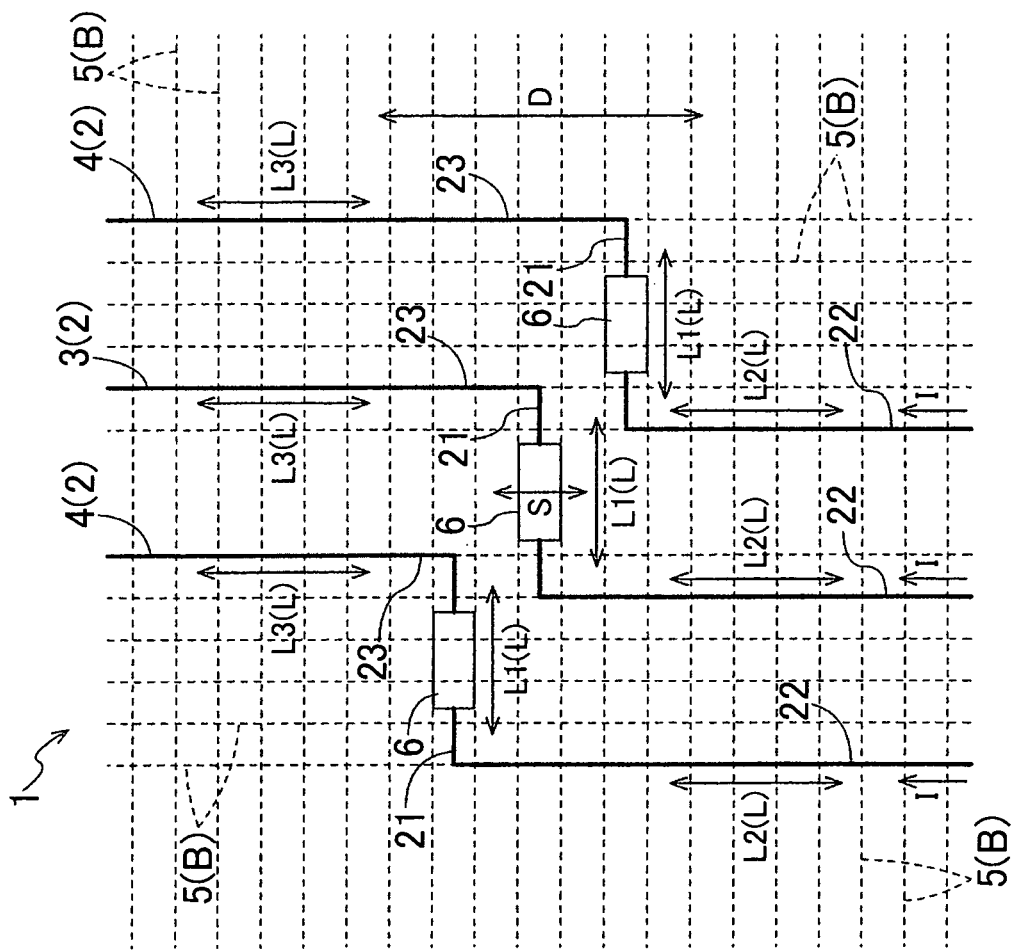
FIG. 7 is a schematic plan view showing a fifth specific example of the arrangement constitution of the current detection apparatus according to this embodiment of the present invention.

Next, a fifth specific example will be described using FIG. 7. The arrangement constitution of the bus bars 2 according to this example differs from the fourth specific example described above in that the positions of the respective bent regions 21 of the three bus bars 2 relative to the reference direction D differ from one another. From among the three bus bars 2, the bent region 21 of the bus bar 2 disposed on the left side (the left side in FIG. 7) from the first side to the second side of the reference direction D is disposed closest to the second side (the upper side in FIG. 7) of the reference direction D, the bent region 21 of the central bus bar 2 is disposed closer to the first side of the reference direction D, and the bent region 21 of the right side bus bar 2 is disposed even further closer to the first side of the reference direction D. Note, however, that in this example also, all of the three bus bars 2 include a bent region 21 that is bent rightward (rightward in FIG. 6) from the first side to the second side of the reference direction D at a right angle to the reference direction D and has an extension direction L1 that is orthogonal to the reference direction D. Hence, in this example, the bent region 21 of the bus bar 2 disposed on a bending direction side (the right side in FIG. 6) of the bent region 21 is disposed closer to the first side of the reference direction D than the bent region 21 of the bus bar 2 that is adjacent thereto on the opposite side (the left side in FIG. 6) of the bending direction. Note that in this example also, the extension direction L1 of the bent region 21 is set to be precisely orthogonal to the reference direction D.

Similarly to the fourth specific example, the bent regions 21 of the two adjacent bus bars 4 disposed on both sides of the central subject bus bar 3 are disposed so as not to overlap the sensor unit 6 provided on the subject bus bar 3 in an orthogonal direction to the reference direction D, i.e. the extension direction L1 of the bent region 21. Thus, the bus bars 2 can be set such that none of the extension orthogonal planes 5 of the respective portions in the bent regions 21 of the adjacent bus bars 4 pass through the sensor unit 6. Note, however, that in this example, the bent regions 21 of the two adjacent bus bars 4 are disposed to partially overlap the bent region 21 of the subject bus bar 3 in the extension direction L1 of the bent region 21.

Otherwise, the fifth specific example is constituted basically identically to the fourth specific example. Therefore, regardless of which of the three bus bars 2 is set as the subject bus bar 3, the extension orthogonal planes 5 that pass through the sensor unit 6 of the subject bus bar 3, from among the extension orthogonal planes 5 of the respective portions of the adjacent bus bar 4 disposed adjacent to the subject bus bar 3, pass through the sensor unit 6 in the substantially orthogonal direction to the magnetic field detection direction S. Hence, with the constitution according to this example also, the extension orthogonal planes 5 that pass through all of the sensor units 6 of the three bus bars 2, from among the extension orthogonal planes 5 of the respective portions of the adjacent bus bar 4, pass through the sensor units 6 in the substantially orthogonal direction to the magnetic field detection direction S. As a result, the magnetic field B generated by each of the three bus bars 2 can be detected with a high degree of precision, enabling high precision detection of the current I flowing through each bus bar 2.

5-6 Sixth Specific Example

Figure 8:
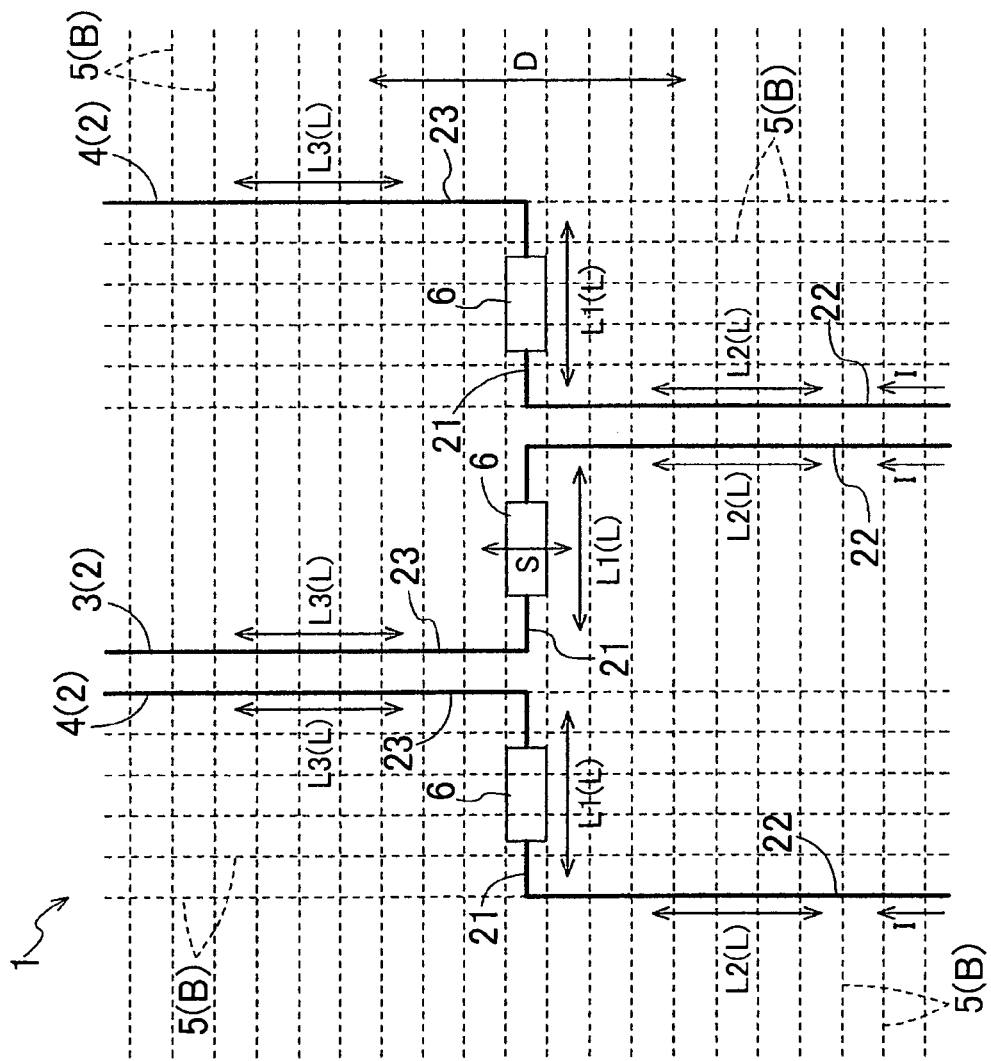
FIG. 8 is a schematic plan view showing a sixth specific example of the arrangement constitution of the current detection apparatus according to this embodiment of the present invention.

Next, a sixth specific example will be described using FIG. 8. The arrangement constitution of the bus bars 2 according to this example differs from the fourth specific example described above in that two adjacent bus bars 2 from among the three bus bars 2 are bent in different directions to each other. Here, from among the three bus bars 2 disposed in parallel, the bending direction of the bent region 21 in the central bus bar 2 is different from the bending direction of the bent regions 21 in the other two bus bars 2. More specifically, the central bus bar 2 of the three bus bars 2 is bent leftward (leftward in FIG. 8) from the first side to the second side of the reference direction D at a right angle relative to the reference direction D, and the two bus bars 2 provided on both sides of the central bus bar 2 are bent rightward (rightward in FIG. 8) from the first side to the second side of the reference direction D at a right angle relative to the reference direction D. Note that in this example also, the extension direction L1 of the bent region 21 is set to be precisely orthogonal to the reference direction D.

Otherwise, the sixth specific example is constituted basically identically to the fourth specific example described above. Accordingly, similar actions and effects to the fourth specific example can be obtained with the constitution of this example.

5-7 Seventh Specific Example

Figure 9:
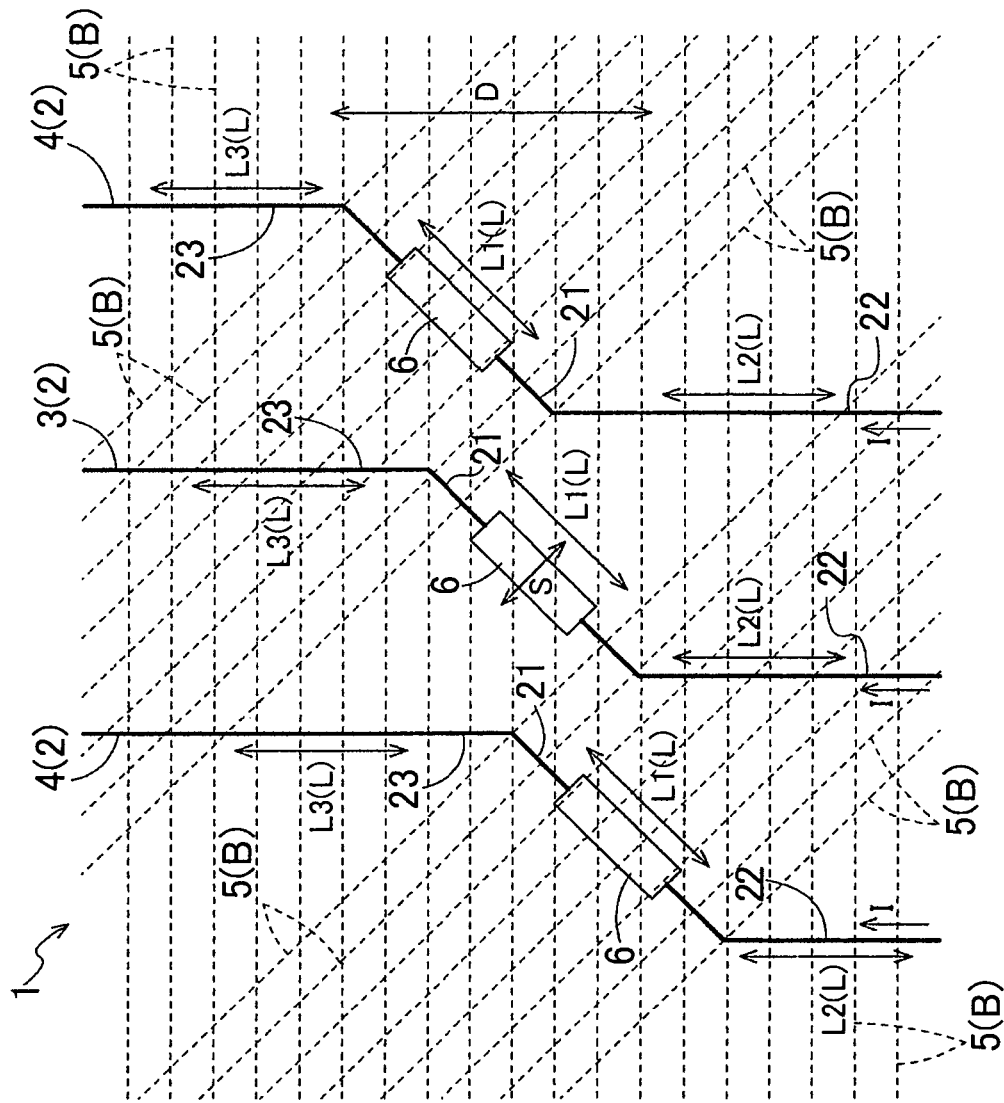
FIG. 9 is a schematic plan view showing a seventh specific example of the arrangement constitution of the current detection apparatus according to this embodiment of the present invention.

Next, a seventh specific example will be described using FIG. 9. The arrangement constitution of the bus bars 2 according to this example differs from the first specific example described above in that the positions of the respective bent regions 21 of the three bus bars 2 relative to the reference direction D differ from one another. Here, the bent region 21 of the bus bar 2 disposed on the right side (the right side in FIG. 9) of the three bus bars 2 from the first side to the second side of the reference direction D is disposed closest to the second side (the upper side in FIG. 9) of the reference direction D, the bent region 21 of the central bus bar 2 is disposed closer to the first side of the reference direction D than the bend region 21 of the right side bus bar 2, and the bent region 21 of the left side bus bar 2 is disposed closer to the first side of the reference direction D than the bent region 21 of the central bus bar 2. Note that in this example also, the extension direction L1 of the bent region 21 is set at an incline of 45° relative to the reference direction D. Similarly to the first specific example described above, this incline angle relative to the reference direction D is just an example, and the incline angle relative to the reference direction D may be set appropriately within a range of 5° to 85°, or preferably 30° to 80°, for example.

Further, the bent regions 21 of the two adjacent bus bars 4 disposed on both sides of the central subject bus bar 3 are disposed so as not to overlap the sensor unit 6 provided on the subject bus bar 3 in the extension direction L1 of the bent region 21. In other words, the sensor unit 6 of the subject bus bar 3 and the bent regions 21 of the two adjacent bus bars 4 are disposed such that no parts thereof are provided in identical positions (overlapping positions) on a parallel coordinate axis to the extension direction L1. Thus, the bus bars 2 are set such that none of the extension orthogonal planes 5 of the respective portions in the bent regions 21 of the adjacent bus bars 4 pass through the sensor unit 6. Hence, according to this example, from among the extension orthogonal planes 5 of the respective portions of the adjacent bus bars 4, only the extension orthogonal planes 5 of the respective portions in the first side parallel region 22 and second side parallel region 23 pass through the sensor unit 6. As shown in FIG. 9, in this example, the extension orthogonal planes 5 of the respective portions in the first side parallel region 22 and second side parallel region 23 of the adjacent bus bar 4 are set in a direction that intersects the magnetic field detection direction S of the sensor unit 6 provided on the subject bus bar 3 by a predetermined angle. Here, the angle at which the extension orthogonal planes 5 of the adjacent bus bar 4 intersect the magnetic field detection direction S is equal to the angle at which the extension direction L1 of the bent region 21 inclines relative to the reference direction D, i.e. 45° in this example. Hence, in this example, from among the extension orthogonal planes 5 of the respective portions of the adjacent bus bar 4, the extension orthogonal planes 5 that pass through the sensor unit 6 of the subject bus bar 3 pass through the sensor unit 6 in a direction that intersects the magnetic field detection direction S by a predetermined angle (45° in this example; likewise hereafter).

Therefore, with the arrangement constitution of the bus bars 2 according to this example, the magnetic flux of the magnetic field B generated from the respective portions of the adjacent bus bar 4 also basically passes through the sensor unit 6 of the subject bus bar 3 in the direction that intersects the magnetic field detection direction S of the sensor unit 6 by the predetermined angle. As described above, the sensor unit 6 detects only the magnetic field B generated in the magnetic field detection direction S, and therefore detects only the vector component, in the magnetic field detection direction S, of the magnetic field B generated in the intersecting direction relative to the magnetic field detection direction S. Hence, according to this example, only a vector component, which is a part of the magnetic field B generated from the adjacent bus bar 4, is detected by the sensor unit 6 of the subject bus bar 3. Accordingly, the amount of the magnetic field B generated from the adjacent bus bar 4 that is detected by the sensor unit 6 can be suppressed, and the magnetic field B generated from the subject bus bar 3 can be detected by the sensor unit 6 with a high degree of precision. As a result, the current I flowing through the subject bus bar 3 can be detected with a high degree of precision.

The cases where the bus bar 2 disposed in the center of the three bus bars 2 is set as the subject bus bar 3 have been described above. However, either of the two remaining bus bars 2 may be set as the subject bus bar 3 such that the central bus bar 2 adjacent to the subject bus bar 3 serves as the adjacent bus bar 4, and in such a case, the relationship between the extension orthogonal planes 5 of the respective portions of the adjacent bus bar 4 and the sensor unit 6 or the bent region 21 of the subject bus bar 3 is similar to that described above. In other words, regardless of which of the three bus bars 2 provided with the sensor units 6 is set as the subject bus bar 3 in this example, the extension orthogonal planes 5 that pass through the sensor unit 6 of the subject bus bar 3, from among the extension orthogonal planes 5 of the respective portions of the adjacent bus bar 4, pass through the sensor unit 6 in a direction that intersects the magnetic field detection direction S by a predetermined angle. Hence, according to this example, all of the sensor units 6 of the three bus bars 2 are constituted such that the extension orthogonal planes 5 that pass through the sensor unit 6 of the subject bus bar 3, from among the extension orthogonal planes 5 of the respective portions of the adjacent bus bar 4, pass through the sensor unit 6 in the direction that intersects the magnetic field detection direction S by the predetermined angle. Thus, the magnetic fields B generated respectively from the three bus bars 2 can be detected with a high degree of precision, enabling high precision detection of the current I flowing through the respective bus bars 2.

Note that in this example, the respective extension directions L1 of the bent regions 21 of the three bus bars 2 are set to incline at an identical incline angle (45° in this example) relative to the reference direction D. However, the incline angle of the extension direction L1 relative to the reference direction D may be set to vary among some or all of the three (plurality of) bent regions 21.

5-8 Eighth Specific Example

Figure 10:
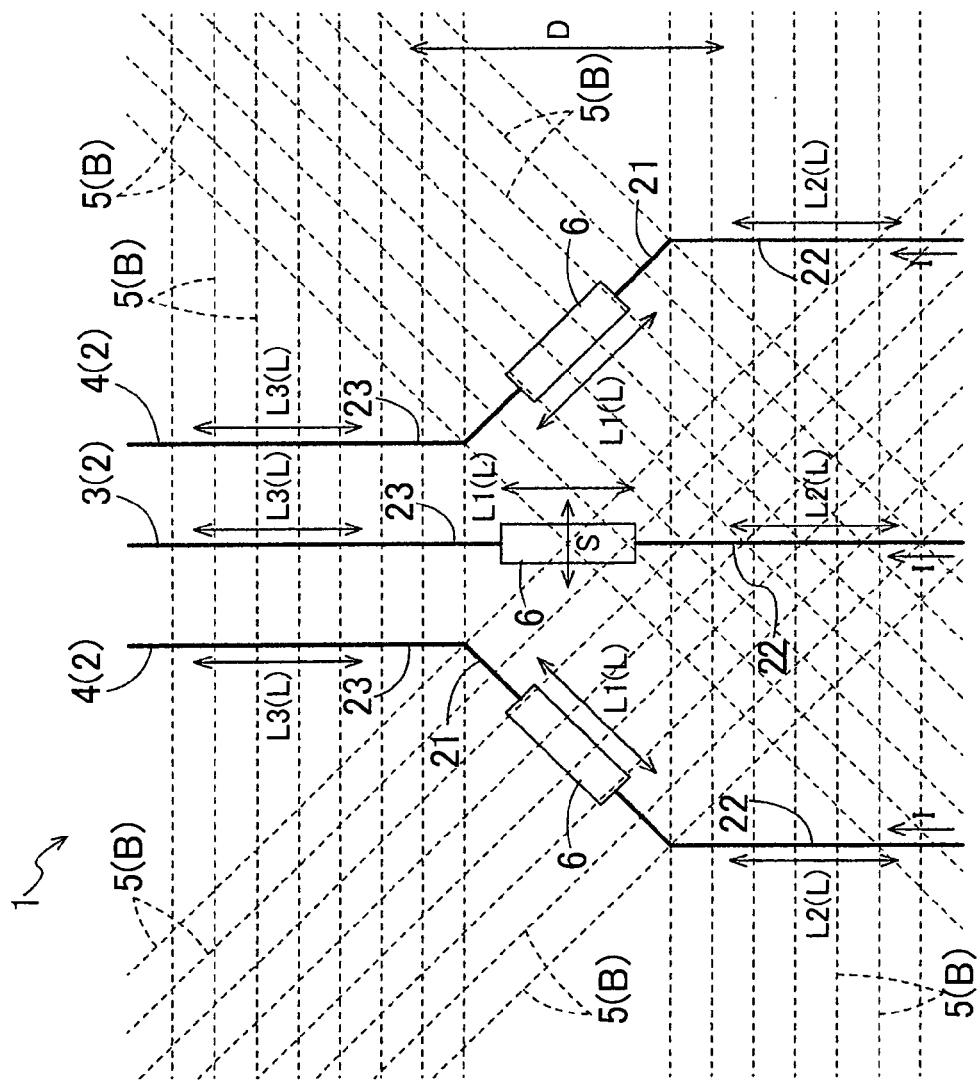
FIG. 10 is a schematic plan view showing an eighth specific example of the arrangement constitution of the current detection apparatus according to this embodiment of the present invention.

Next, an eighth specific example will be described using FIG. 10. The arrangement constitution of the bus bars 2 according to this example differs from the specific examples described above in that only two of the three bus bars 2 include the bent region 21 while the remaining bus bar 2 takes a rectilinear shape not including the bent region 21. Here, the central bus bar 2 of the three bus bars 2 is set as the rectilinear bus bar 2 that does not include the bent region 21, while the two adjacent bus bars 2 disposed on both sides of the central bus bar 2 each include the bent region 21. The two bus bars 2 disposed on both sides include bent regions 21 having different extension directions L1. More specifically, the right side bus bar 2 includes the bent region 21 having an extension direction L1 that inclines leftward (leftward in FIG. 10) from the first side to the second side of the reference direction D, while the left side bus bar 2 includes the bent region 21 having the extension direction L1 that inclines rightward (rightward in FIG. 10) from the first side to the second side of the reference direction D. The respective extension directions L1 of the bent regions 21 of the two bus bars 2 are both set to incline relative to the reference direction D by 45°. Note that this incline angle relative to the reference direction D is just an example, and the incline angle relative to the reference direction D may be set appropriately within a range of 5° to 85°, or preferably 30° to 80°, for example. In the centrally disposed rectilinear bus bar 2, the boundary between the first side parallel region 22 and the second side parallel region 23 is not clear. Hence, in this embodiment, the first side of the reference direction D relative to the detection portion 31 used by the sensor unit 6 is set as the first side parallel region 22, and the second side of the reference direction D relative to the detection portion 31 is set as the second side parallel region 23.

First, the case where the rectilinear bus bar 2 disposed in the center of the three bus bars 2 is set as the subject bus bar 3 will be described. In FIG. 10, the extension orthogonal planes 5 of the respective portions of the adjacent bus bars 4 in this case are indicated by broken lines. In this example, the first side parallel regions 22 and second side parallel regions 23 of the adjacent bus bars 4 disposed on both sides of the subject bus bar 3 are disposed so as not to overlap the sensor unit 6 of the subject bus bar 3 in the reference direction D. In other words, the sensor unit 6 of the subject bus bar 3 and the first side parallel regions 22 and second side parallel regions 23 of the two adjacent bus bars 4 are disposed such that no parts thereof are provided in identical positions (overlapping positions) on a parallel coordinate axis to the reference direction D. Thus, the bus bars 2 can be set such that none of the extension orthogonal planes 5 of the respective portions in the first side parallel regions 22 and second side parallel regions 23 of the adjacent bus bars 4 pass through the sensor unit 6 of the subject bus bar 3. Hence, according to this example, from among the extension orthogonal planes 5 of the respective portions of the adjacent bus bar 4, only the extension orthogonal planes 5 of the respective portions of the bent region 21 pass through the sensor unit 6. Furthermore, in this example, as shown in FIG. 10, the extension orthogonal planes 5 of the respective portions of the bent region 21 of the adjacent bus bar 4 intersect the magnetic field detection direction S of the sensor unit 6 provided on the subject bus bar 3 by a predetermined angle. Here, the angle at which the extension orthogonal planes 5 of the adjacent bus bar 4 intersect the magnetic field detection direction S is equal to the angle at which the extension direction L1 of the bent region 21 inclines relative to the reference direction D, i.e. 45° in this example. Hence, in this example, from among the extension orthogonal planes 5 of the respective portions of the adjacent bus bar 4, the extension orthogonal planes 5 that pass through the sensor unit 6 of the subject bus bar 3 pass through the sensor unit 6 in a direction that intersects the magnetic field detection direction S by a predetermined angle (45° in this example; likewise hereafter).

Next, the case where the one of the two bus bars 2 disposed on both sides, each including the bent region 21, is set as the subject bus bar 3 will be described. In this case, the adjacent bus bar 4 adjacent to the subject bus bar 3 is the centrally disposed rectilinear bus bar 2. Note, however, that the reference numerals and broken lines indicating the extension orthogonal planes 5 in FIG. 10 do not correspond to this case. According to this example, the extension orthogonal planes 5 of the respective portions in the region of the rectilinear adjacent bus bar 4 that is parallel to the reference direction D (the first side parallel region 22 or the second side parallel region 23) pass through the sensor unit 6 of the subject bus bar 3. Furthermore, in this example, as shown in FIG. 10, the sensor unit 6 of the subject bus bar 3 uses the bent region 21 disposed at an incline relative to the reference direction D as the detection portion 31, while the magnetic field detection direction S of the sensor unit 6 is set to incline in an orthogonal direction relative to the reference direction D. Therefore, in this example, the extension orthogonal planes 5 that pass through the sensor unit 6 of the subject bus bar 3, from among the extension orthogonal planes 5 of the respective portions of the adjacent bus bar 4, pass through the sensor unit 6 in a direction that intersects the magnetic field detection direction S by a predetermined angle. Here, the angle at which the extension orthogonal planes 5 of the adjacent bus bar 4 intersect the magnetic field detection direction S is equal to the angle at which the extension direction L1 of the bent region 21 inclines relative to the reference direction D. This applies likewise regardless of which of the two bus bars 2 disposed on both sides, each including the bent region 21, is set as the subject bus bar 3.

As described above, with the arrangement constitution of the bus bars 2 according to this example, the magnetic flux of the magnetic field B generated from the respective portions of the adjacent bus bar 4 basically passes through the sensor unit 6 of the subject bus bar 3 in the direction that intersects the magnetic field detection direction S of the sensor unit 6 by the predetermined angle regardless of which of the three bus bars 2 provided with the sensor units 6 is set as the subject bus bar 3. As described above, the sensor unit 6 detects only the magnetic field B generated in the magnetic field detection direction S, and therefore detects only the vector component, in the magnetic field detection S, of the magnetic field B generated in the intersecting direction relative to the magnetic field detection direction S. Hence, according to this example, only the vector component, which is a part of the magnetic field B generated from the adjacent bus bar 4, is detected by the sensor unit 6 of the subject bus bar 3. Accordingly, the amount of the magnetic field B generated from the adjacent bus bar 4 that is detected by the sensor unit 6 can be suppressed, and the magnetic field B generated from the subject bus bar 3 can be detected by the sensor unit 6 with a high degree of precision. As a result, the current I flowing through the subject bus bar 3 can be detected with a high degree of precision.

5-9 Ninth Specific Example

Figure 11:
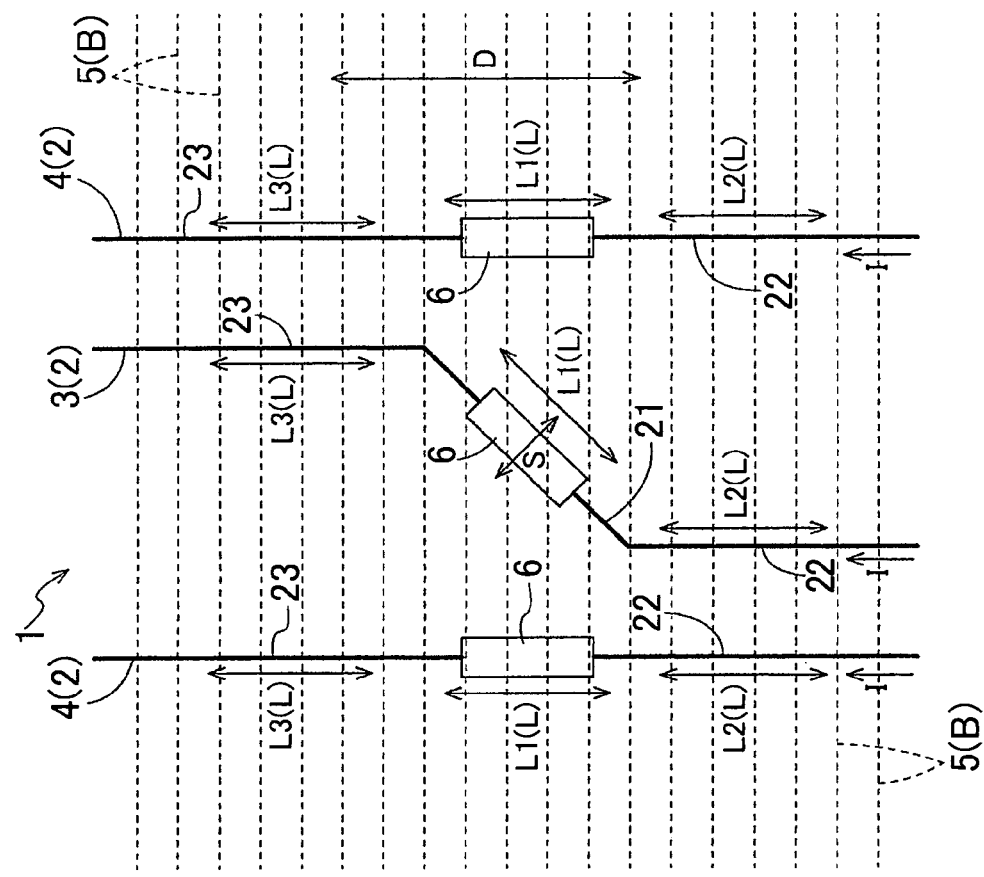
FIG. 11 is a schematic plan view showing a ninth specific example of the arrangement constitution of the current detection apparatus according to this embodiment of the present invention.

Next, a ninth specific example will be described using FIG. 11. The arrangement constitution of the bus bars 2 according to this example is similar to the eighth specific example in that only a part of the three bus bars 2 includes the bent region 21. However, this example differs from the eighth specific example in that only the central bus bar 2 of the three bus bars 2 includes the bent region 21 while the two bus bars 2 disposed on both sides of the central bus bar 2 take a rectilinear shape not including the bent region 21. The central bus bar 2 includes the bent region 21 having the extension direction L1 that inclines rightward (rightward in FIG. 11) from the first side to the second side of the reference direction D. The extension direction L1 of the bent region 21 of this bus bar 2 is set to incline relative to the reference direction D by 45°. Note that this incline angle relative to the reference direction D is just an example, and the incline angle relative to the reference direction D may be set appropriately within a range of 5° to 85°, or preferably 30° to 80°, for example. In the two rectilinear bus bars 2 disposed on both sides, the boundary between the first side parallel region 22 and the second side parallel region 23 is not clear. Hence, in this embodiment, the first side of the reference direction D relative to the detection portion 31 used by the sensor unit 6 is set as the first side parallel region 22, and the second side of the reference direction D relative to the detection portion 31 is set as the second side parallel region 23.

First, the case where the bus bar 2 that is disposed in the center of the three bus bars 2 and includes the bent region 21 is set as the subject bus bar 3 will be described. In FIG. 11, the extension orthogonal planes 5 of the respective portions of the adjacent bus bars 4 in this case are indicated by broken lines. In this example, the extension orthogonal planes 5 of the respective portions in the regions of the rectilinear adjacent bus bars 4 that are parallel to the reference direction D (the first side parallel regions 22 and second side parallel regions 23) pass through the sensor unit 6 of the subject bus bar 3. Furthermore, in this example, as shown in FIG. 11, the sensor unit 6 of the subject bus bar 3 uses the bent region 21 disposed at an incline relative to the reference direction D as the detection portion 31, while the magnetic field detection direction S of the sensor unit 6 is set to incline in an orthogonal direction relative to the reference direction D. Hence, according to this example, from among the extension orthogonal planes 5 of the respective portions of the adjacent bus bar 4, the extension orthogonal planes 5 that pass through the sensor unit 6 of the subject bus bar 3 pass through the sensor unit 6 in a direction that intersects the magnetic field detection direction S by a predetermined angle. Here, the angle at which the extension orthogonal planes 5 of the adjacent bus bar 4 intersect the magnetic field detection direction S is equal to the angle at which the extension direction L1 of the bent region 21 inclines relative to the reference direction D, i.e. 45° in this example.

Next, the case where the one of the two rectilinear bus bars 2 disposed on both sides is set as the subject bus bar 3 will be described. In this case, the adjacent bus bar 4 adjacent to the subject bus bar 3 is the centrally disposed bus bar 2 including the bent region 21. Note, however, that the reference numerals and broken lines indicating the extension orthogonal planes 5 in FIG. 11 do not correspond to this case. According to this example, the first side parallel region 22 and second side parallel region 23 of the adjacent bus bar 4 that is disposed adjacent to the subject bus bar 3 and includes the bent region 21 are disposed so as not to overlap the sensor unit 6 of the subject bus bar 3 in the reference direction D. In other words, the sensor unit 6 of the subject bus bar 3 and the first side parallel region 22 and second side parallel region 23 of the adjacent bus bar 4 are disposed such that no parts thereof are provided in identical positions (overlapping positions) on a parallel coordinate axis to the reference direction D. Thus, the bus bars 2 can be set such that none of the extension orthogonal planes 5 of the respective portions in the first side parallel region 22 and second side parallel region 23 of the adjacent bus bar 4 pass through the sensor unit 6 of the subject bus bar 3. Hence, according to this example, from among the extension orthogonal planes 5 of the respective portions of the adjacent bus bar 4, only the extension orthogonal planes 5 of the respective portions of the bent region 21 pass through the sensor unit 6. Furthermore, in this example, as shown in FIG. 11, the extension orthogonal planes 5 of the respective portions in the bent region 21 of the adjacent bus bar 4 intersect the magnetic field detection direction S of the sensor unit 6 provided on the subject bus bar 3 by a predetermined angle. Hence, in this example, from among the extension orthogonal planes 5 of the respective portions of the adjacent bus bar 4, the extension orthogonal planes 5 that pass through the sensor unit 6 of the subject bus bar 3 pass through the sensor unit 6 in a direction that intersects the magnetic field detection direction S by a predetermined angle. Here, the angle at which the extension orthogonal planes 5 of the adjacent bus bar 4 intersect the magnetic field detection direction S is equal to the angle at which the extension direction L1 of the bent region 21 inclines relative to the reference direction D. This applies likewise regardless of which of the two rectilinear bus bars 2 disposed on both sides is set as the subject bus bar 3.

As described above, with the arrangement constitution of the bus bars 2 according to this example, the magnetic flux of the magnetic field B generated from the respective portions of the adjacent bus bar 4 basically passes through the sensor unit 6 of the subject bus bar 3 in the direction that intersects the magnetic field detection direction S of the sensor unit 6 by the predetermined angle, regardless of which the three bus bars 3 provided with the sensor units 6 is set as the subject bus bar 3. As described above, the sensor unit 6 detects only the magnetic field B generated in the magnetic field detection direction S, and therefore detects only the vector component, in the magnetic field detection direction S, of the magnetic field B generated in the intersecting direction relative to the magnetic field detection direction S. Hence, according to this example, only the vector component, which is a part of the magnetic field B generated from the adjacent bus bar 4, is detected by the sensor unit 6 of the subject bus bar 3. Accordingly, the amount of the magnetic field B generated from the adjacent bus bar 4 that is detected by the sensor unit 6 can be suppressed, and the magnetic field B generated from the subject bus bar 3 can be detected by the sensor unit 6 with a high degree of precision. As a result, the current I flowing through the subject bus bar 3 can be detected with a high degree of precision.

5-10 Tenth Specific Example

In all of the first to ninth specific examples, the examples in which the center lines of the plurality of bus bars 2 are coplanar have been described. However, the embodiments of the present invention are not limited to this constitution. Accordingly, a tenth specific example in which the center lines of the plurality of bus bars 2 are disposed three-dimensionally will now be described using FIG. 12. In this example, the center lines of the three bus bars 2 are disposed on different parallel planes, and each bus bar 2 includes the bent region 21. Further, in two adjacent bus bars 2, the extension directions L1 of the respective bent regions 21 differ from each other on the planes on which the respective center lines of the bus bars 2 exist. Here, the extension direction L1 of the bent region 21 provided in the central bus bar 2 of the three bus bars 2 disposed in parallel differs from the extension directions L1 of the other two bus bars 2. More specifically, the central bus bar 2 includes the bent region 21 having the extension direction L1 that is inclined leftward (leftward in FIG. 12) from the first side to the second side of the reference direction D, while the two bus bars 2 disposed on both sides of the central bus bar 2 include the bent regions 21 having the extension direction L1 inclined rightward (rightward in FIG. 12) from the first side to the second side of the reference direction D at an identical angle relative to the reference direction D. This constitution of the three bus bars 2 corresponds to the constitution in which the three bus bars 2 according to the second specific example shown in FIG. 4 are stacked in an orthogonal direction to the respective planes on which the bus bars 2 exist. The extension directions L1 of the bent regions 21 of the three bus bars 2 are all set to incline relative to the reference direction D by 45°. Note that here, each bus bar 2 takes a strip shape and a width direction thereof is disposed parallel to the plane on which the center line of the bus bar 2 exists.

In this example, the two adjacent bus bars 4 disposed on both sides of the central subject bus bar 3 are disposed such that the respective first side parallel regions 22 and second side parallel regions 23 of the adjacent bus bars 4 do not overlap the sensor unit 6 of the subject bus bar 3 in the reference direction D. In other words, the sensor unit 6 of the subject bus bar 3 and the first side parallel regions 22 and second side parallel regions 23 of the two adjacent bus bars 4 are disposed such that no parts thereof are provided in identical positions (overlapping positions) on a parallel coordinate axis to the reference direction D. Thus, the bus bars 2 can be set such that none of the extension orthogonal planes 5 of the respective portions in the first side parallel regions 22 and second side parallel regions 23 of the adjacent bus bars 4 pass through the sensor unit 6 of the subject bus bar 3. Moreover, in this example, as described above, the extension directions L1 of the bent regions 21 of two adjacent bus bars 2 incline relative to the reference direction D by 45° while differing from (intersecting) each other. Accordingly, the extension direction L1 of the bent region 21 of the subject bus bar 3 and the extension direction L1 of the bent region 21 of the adjacent bus bar 4 are orthogonal. Further, as described above, the magnetic field detection direction S of the sensor unit 6 provided on the subject bus bar 3 is orthogonal to the extension direction L1 of the bent region 21, and therefore the extension orthogonal planes 5 of the respective portions in the bent region 21 of the adjacent bus bar 4 are orthogonal to the magnetic field detection direction S of the sensor unit 6. Hence, in this example, from among the extension orthogonal planes 5 of the respective portions of the adjacent bus bar 4, the extension orthogonal planes 5 that pass through the sensor unit 6 of the subject bus bar 3 pass through the sensor unit 6 in the substantially orthogonal direction to the magnetic field detection direction S.

Therefore, with the arrangement constitution of the bus bars 2 according to this example, the magnetic flux of the magnetic field B generated from the respective portions of the adjacent bus bar 4 also basically passes through the sensor unit 6 of the subject bus bar 3 in the substantially orthogonal direction to the magnetic field detection direction S of the sensor unit 6. As described above, the sensor unit 6 is constituted to detect only the magnetic field B generated in the magnetic field detection direction S and to detect only the vector component, in the magnetic field detection direction S, of the magnetic field B generated in the intersecting direction to the magnetic field detection direction S. Hence, with the constitution according to this example, the vector component, in the magnetic field detection S, of the magnetic field B generated by the adjacent bus bar 4 and detected by the sensor unit 6 of the subject bus bar 3 is basically zero. Accordingly, situations in which the magnetic field B of the adjacent bus bar 4 is detected by the sensor unit 6 can be greatly suppressed, and as a result, the magnetic field B generated by the subject bus bar 3 can be detected by the sensor unit 6 with a high degree of precision. As a result, the current I flowing through the subject bus bar 3 can be detected with a high degree of precision.

Furthermore, in this example, the lengths of all of the bent regions 21 of the three bus bars 2 are set to be identical and the respective bent regions 21 of the three bus bars 2 are disposed in identical positions in the reference direction D. Furthermore, in this example, the three bus bars 2 are formed from identically shaped members disposed in different directions. Therefore, a plurality of types of bus bars 2 having different shapes need not be used to realize the arrangement constitution of the bus bars 2 described above, and as a result, the current detection apparatus 1 can be constructed at a comparatively low cost.

The case where the bus bar 2 disposed in the center of the three bus bars 2 is set as the subject bus bar 3 has been described above. However, when one of the two remaining bus bars 2 is set as the subject bus bar 3 and the central bus bar 2 disposed adjacent to the subject bus bar 3 is set as the adjacent bus bar 4, the relationship between the extension orthogonal plane 5 of each portion of the adjacent bus bar 4 and the sensor unit 6 of the subject bus bar 3 is similar to the relationship described above. In other words, with this example, the extension orthogonal planes 5 that pass through the sensor unit 6 of the subject bus bar 3, from among the extension orthogonal planes 5 of the respective portions of the adjacent bus bar 4, pass through the sensor unit 6 in the substantially orthogonal direction to the magnetic field detection direction S regardless of which of the three bus bars 2 provided with the sensor units 6 is set as the subject bus bar 3. Hence, with the constitution according to this example, the extension orthogonal planes 5 that pass through all of the sensor units 6 of the three bus bars 2, from among the extension orthogonal planes 5 of the respective portions of the adjacent bus bar 4, pass through the sensor units 6 in the substantially orthogonal direction to the magnetic field detection direction S. As a result, the magnetic field B generated by each of the three bus bars 2 can be detected with a high degree of precision, enabling high precision detection of the current I flowing through each bus bar 2.

Note that in this example, the case where the extension direction L1 of the bent region 21 of the subject bus bar 3, selected from the three bus bars 2, is orthogonal to the extension direction L1 of the bent region 21 of the adjacent bus bar 4 has been described. However, the embodiments of the present invention are not limited to this constitution, and in another preferred embodiment of the present invention, an angle formed by the extension direction L1 of the bent region 21 of the subject bus bar 3 and the extension direction L1 of the bent region 21 of the adjacent bus bar 4 may be set at an angle other than 90°. In this case, the magnetic flux of the magnetic field B generated from each portion of the adjacent bus bar 4 basically passes through the sensor unit 6 of the subject bus bar 3 in a direction that intersects the magnetic field detection direction S by a predetermined angle. Hence, in this case, only the vector component, which is a part of the magnetic field B generated by the adjacent bus bar 4, is detected by the sensor unit 6 of the subject bus bar 3, and therefore the amount of the magnetic field B generated by the adjacent bus bar 4 that is detected by the sensor unit 6 can be suppressed.

Further, when the plurality of bus bars 2 are disposed on different parallel planes, as in this example, the angle of the bent region 21 of each bus bar 2 relative to the reference direction D may be set at an angle other than 45°. More specifically, the incline angle relative to the reference direction D may be set appropriately within a range of 5° to 85°, or preferably 30° to 80°, for example. Furthermore, in all cases, the angle between the bent regions 21 of two adjacent bus bars 2 is optimally set at 90°, but may be set at an angle other than 90°. Further, even when the plurality of bus bars 2 are disposed on different parallel planes, the bent region 21 does not have to be provided on all of the three bus bars 2, and a part of the three bus bars 2 may be set as a rectilinear bus bar 2 that does not include the bent region 21, as in the eighth and ninth specific examples described above.

Furthermore, in this example, the constitution in which the bent regions 21 of the three bus bars 2 are arranged in identical positions relative to the reference direction D has been described. However, the embodiments of the present invention are not limited to this constitution, and in another preferred embodiment of the present invention, the bent regions 21 of the three bus bars 2 may be arranged in different positions from each other relative to the reference direction D. In this case, the three bus bars 2 are constituted such that the respective center lines of the bus bars 2 are disposed on different parallel planes, each bus bar 2 includes the bent region 21, and the respective bent regions 21 of the bus bars 2 are disposed in different positions relative to the reference direction D. This constitution of the three bus bars 2 corresponds to the constitution in which the three bus bars 2 of the seventh specific example shown in FIG. 9 are disposed such that the respective center lines of the bus bars 2 are positioned on planes different from and in parallel to each other. With this constitution also, the extension orthogonal planes 5 that pass through the sensor unit 6 of the subject bus bar 3, from among the extension orthogonal planes 5 of the respective portions of the adjacent bus bar 4, pass through the sensor unit 6 in the substantially orthogonal direction to the magnetic field detection direction S.

6. Other Embodiments (1) In the above embodiment, the examples in which the bus bars 2 are formed from strip-shaped conductive members made of copper or the like and having a substantially constant width have been described. However, the embodiments of the present invention are not limited thereto, and any bus bar 2 may be used as long as the bus bar 2 is formed from an elongated rod-shaped conductive member. Therefore, in another preferred embodiment of the present invention, the bus bar 2 may be formed from a rod-shaped member having a circular, rectangular, polygonal, or other cross-sectional shape.

(2) In the above embodiment, the examples in which the current detection apparatus 1 includes three bus bars 2 and all of the bus bars 2 serve as subject bus bars 3 subjected to magnetic field detection by the sensor units 6 have been described. However, the embodiments of the present invention are not limited to this constitution, and in another preferred embodiment of the present invention, only a part of the three bus bars 2 may be used as the subject bus bar 3 and provided with the sensor unit 6. In particular, when the currents of the respective phases of the three-phase alternating current for driving the rotary electric machine MG are passed through the three bus bars 2, it is preferable that only two of the three bus bars 2 be used as the subject bus bar 3 to ensure that the sum of the currents of the respective phases of the three-phase alternating current equal zero. In another preferred embodiment of the present invention, the current detection apparatus 1 may include two bus bars 2 or four or more bus bars 2. In these cases also, all or a part of the plurality of bus bars 2 are preferably used as the subject bus bar 3 and the magnetic field is detected by the sensor unit 6 disposed in the vicinity of the detection portion 31 of each bus bar 2. Note that when the current detection apparatus 1 includes two bus bars 2, in another preferred embodiment of the present invention, any two of the bus bars 2 provided in the various specific examples including three bus bars 2 described above may be selected.

(3) In all of the specific examples of the above embodiment, when the bus bar 2 includes the bent region 21, the detection portion 31 used by the sensor unit 6 is provided in the bent region 21. However, the embodiments of the present invention are not limited to this constitution, and in another preferred embodiment of the present invention, when the bus bar 2 includes the bent region 21, the detection portion 31 used by the sensor unit 6 may be provided in a portion outside of the bent region 21.

(4) In the above embodiment, the plurality of specific examples of the arrangement constitution of the bus bars 2 have been described. However, the embodiments of the present invention are not limited to these specific examples. More specifically, as long as the embodiments of the present invention employ the constitution in which none of the extension orthogonal planes 5 of the respective portions of the adjacent bus bar 4 pass through the sensor unit 6 in a parallel direction to the magnetic field detection direction S, regardless of which of the bus bars 2 provided with the sensor units 6 is set as the subject bus bar 3 from among the plurality of bus bars 2, various arrangement constitutions of the bus bars 2 other than those described above may be employed. For example, in another preferred embodiment of the present invention, the center lines of the plurality of bus bars 2 may be disposed in positions that are offset rather than coplanar in the constitutions of the first to ninth specific examples described above. In this case, the respective planes on which the plurality of bus bars 2 exist may be disposed parallel to each other or so as to intersect each other.

(5) In the above embodiment, the examples in which the current detection apparatus 1 uses the three bus bars 2U, 2V, 2W through which a drive current for driving the rotary electric machine MG, which is driven by a three-phase alternating current, as subjects have been described. However, the embodiments of the present invention are not limited to these specific examples, and the present invention may be applied to various current detection apparatuses used for various applications as long as at least one of a plurality of bus bars disposed in parallel is set as a subject bus bar and a current flowing through the subject bus bar is detected on the basis of the magnetic field generated in the vicinity of the subject bus bar. Hence, in another preferred embodiment of the present invention, the current detection apparatus 1 may be constituted such that at least two bus bars through which a power supply current for various machines driven by a single-phase alternating current power supply flows are set as subject bus bars, for example.

The present invention may be used favorably in a current detection apparatus in which at least one of a plurality of bus bars disposed in parallel is set as a subject bus bar and a current flowing through the subject bus bar is detected on the basis of a magnetic field generated in the vicinity of the subject bus bar.

What is claimed is:

1. A current detection apparatus that sets at least one of a plurality of bus bars disposed in parallel as a subject bus bar and detects a current flowing through the subject bus bar on the basis of a magnetic field generated in the vicinity of the subject bus bar, wherein a sensor unit that detects the magnetic field in a predetermined magnetic field detection direction is disposed in the vicinity of a detection portion of the subject bus bar such that the magnetic field detection direction is substantially orthogonal to an extension direction of the subject bus bar at the detection portion, one of the plurality of bus bars that is disposed adjacent to the subject bus bar is set as an adjacent bus bar, a plane that is orthogonal to an extension direction of each portion of the adjacent bus bar is set as an extension orthogonal plane of the portion, the extension direction of each portion of the adjacent bus bar relative to the sensor unit is set such that none of the extension orthogonal planes of the respective portions of the adjacent bus bar pass through the sensor unit in a parallel direction to the magnetic field detection direction, the plurality of bus bars each include a first side parallel region that is disposed on a first side of a predetermined reference direction and has an extension direction that is parallel to the reference direction, a second side parallel region that is disposed on a second side of the reference direction relative to the first side parallel region and has an extension direction that is parallel to the reference direction, and a bent region that is disposed between the first side parallel region and the second side parallel region and has an extension direction that is different from the reference direction and is different from a direction orthogonal to the reference direction, the detection portion is provided in the bent region of the subject bus bar, the first side parallel region and the second side parallel region of the adjacent bus bar are disposed so as not to overlap the sensor unit in the reference direction, and the sensor unit detects the current flowing in a direction that is different from the reference direction.

2. The current detection apparatus according to claim 1, wherein all of the plurality of bus bars include the bent regions having identical extension directions, and the bent region provided in the adjacent bus bar is disposed so as not to overlap the sensor unit in the extension direction of the bent region.

3. The current detection apparatus according to claim 1, wherein two of the bus bars that are adjacent to each other include the bent regions having different extension directions from each other.

4. The current detection apparatus according to claim 1, wherein the plurality of bus bars are constituted by identically shaped members.

5. The current detection apparatus according to claim 1, wherein center lines of the plurality of bus bars are disposed to be coplanar.

6. The current detection apparatus according to claim 1, wherein the plurality of bus bars are constituted by three bus bars through which a three-phase alternating current for driving a rotary electric machine flows, and at least two of the three bus bars are set as the subject bus bar.

7. The current detection apparatus according to claim 1, wherein the sensor unit is constituted by a coreless magnetic field detection sensor not having a flux concentration core, and does not include a shield against an external magnetic field other than the magnetic field generated by the subject bus bar.

8. A current detection apparatus that sets at least one of a plurality of bus bars disposed in parallel as a subject bus bar and detects a current flowing through the subject bus bar on the basis of a magnetic field generated in the vicinity of the subject bus bar, wherein a sensor unit that detects the magnetic field in a predetermined magnetic field detection direction is disposed in the vicinity of a detection portion of the subject bus bar such that the magnetic field detection direction is substantially orthogonal to an extension direction of the subject bus bar at the detection portion, the plurality of bus bars each include a first side parallel region that is disposed on a first side of a predetermined reference direction and has an extension direction that is parallel to the reference direction, a second side parallel region that is disposed on a second side of the reference direction relative to the first side parallel region and has an extension direction that is parallel to the reference direction, and a bent region that is disposed between the first side parallel region and the second side parallel region and has an extension direction that is different from the reference direction and is different from a direction orthogonal to the reference direction, the detection portion is provided in the bent region of the subject bus bar, the first side parallel region and the second side parallel region of an adjacent bus bar disposed adjacent to the subject bus bar are disposed so as not to overlap the sensor unit in the reference direction, and the sensor unit detects the current flowing in a direction that is different from the reference direction.

9. The current detection apparatus according to claim 8, wherein all of the plurality of bus bars include the bent regions having identical extension directions, and the bent region provided in one of the bus bars disposed adjacent to the subject bus bar is disposed so as not to overlap the sensor unit in the extension direction of the bent region.

10. The current detection apparatus according to claim 8, wherein the subject bus bar and one of the bus bars that is disposed adjacent to the subject bus bar include the respective bent regions having the different extension directions from each other.

\* \* \* \* \*